United States Patent
Moldovan

(10) Patent No.: US 10,183,375 B2
(45) Date of Patent: Jan. 22, 2019

(54) BATCH-PROCESSING METHOD FOR SUPER-HIGH ASPECT RATIO DIFFRACTIVE OPTICS

(71) Applicant: Alcorix Co., Plainfield, IL (US)

(72) Inventor: Nicolaie A. Moldovan, Plainfield, IL (US)

(73) Assignee: Alcorix Co., Plainfield, IL (US)

( * ) Notice: Subject to any disclaimer, the term of this patent is extended or adjusted under 35 U.S.C. 154(b) by 0 days.

(21) Appl. No.: 15/363,950

(22) Filed: Nov. 29, 2016

(65) Prior Publication Data

US 2017/0256330 A1    Sep. 7, 2017

Related U.S. Application Data

(60) Provisional application No. 62/302,352, filed on Mar. 2, 2016.

(51) Int. Cl.
  *C23C 14/04* (2006.01)
  *C23C 16/04* (2006.01)
  (Continued)

(52) U.S. Cl.
  CPC ............ *B24B 37/042* (2013.01); *B24B 7/228* (2013.01); *C23C 14/042* (2013.01);
  (Continued)

(58) Field of Classification Search
  None
  See application file for complete search history.

(56) References Cited

U.S. PATENT DOCUMENTS 7,365,918 B1 *  4/2008  Yun .................. G21K 1/06
                                                        359/741
2012/0258243 A1  10/2012  Schuetz et al.
  (Continued)

FOREIGN PATENT DOCUMENTS

WO   2004010228 A2   1/2004

OTHER PUBLICATIONS

D. Habs et al., "Refractive Index of Silicon at γ Ray Energies", Phys. Rev. Lett. 108, 184802—Published May 1, 2012.
  (Continued)

*Primary Examiner* — Stephanie P Duclair
(74) *Attorney, Agent, or Firm* — Leber IP Law; Dennis R. Haszko

(57) ABSTRACT

A method for fabrication of diffractive optics by batch processing is disclosed, having applicability to high resolution ultra-high aspect ratio Fresnel Zone Plates for focusing of X-rays or gamma-rays having energies up to hundreds of keV. An array of precursor forms is etched into a planar substrate. Sidewalls of the forms are smoothed to a required surface roughness. A sequence of alternating layers of different complex refractive index, for binary or higher order diffractive optics, are deposited on the precursor forms by atomic layer deposition (ALD), to provide diffractive line patterns. Thinnest layers may have nanometer thicknesses. After front surface planarization and thinning of the substrate to expose first and second surfaces of the diffractive line patterns of the diffractive optic, the height h in the propagation direction provides a designed absorption difference and/or phase shift difference between adjacent diffractive lines. Optionally, post-processing enhances mechanical, thermal, electrical and optical properties.

32 Claims, 12 Drawing Sheets

(51) Int. Cl.
| | |
|---|---|
| H01L 51/00 | (2006.01) |
| H01L 21/321 | (2006.01) |
| H01L 21/02 | (2006.01) |
| H01L 21/768 | (2006.01) |
| B24B 37/04 | (2012.01) |
| C23C 16/455 | (2006.01) |
| C23C 16/02 | (2006.01) |
| B24B 7/22 | (2006.01) |
| C23C 16/06 | (2006.01) |
| C23C 16/34 | (2006.01) |
| G21K 1/06 | (2006.01) |

(52) U.S. Cl.
CPC ........ *C23C 16/0227* (2013.01); *C23C 16/042* (2013.01); *C23C 16/045* (2013.01); *C23C 16/06* (2013.01); *C23C 16/342* (2013.01); *C23C 16/45529* (2013.01); *C23C 16/45555* (2013.01); *G21K 1/06* (2013.01); *H01L 21/02065* (2013.01); *H01L 21/32115* (2013.01); *H01L 21/7684* (2013.01); *H01L 51/0011* (2013.01); *B81C 2201/0104* (2013.01); *G21K 2201/067* (2013.01); *Y10S 148/05* (2013.01)

(56) References Cited

U.S. PATENT DOCUMENTS

| | | |
|---|---|---|
| 2013/0280421 A1 | 10/2013 | Je et al. |
| 2014/0057446 A1 | 2/2014 | Yu et al. |
| 2015/0376798 A1* | 12/2015 | Sakdinawat ............ G21K 1/06 216/51 |
| 2016/0086681 A1* | 3/2016 | Leung .................... G21K 1/06 378/84 |

OTHER PUBLICATIONS

B. Lai et al., "Hard x-ray phase zone plate fabricated by lithographic techniques", Appl. Phys. Lett. 61(16), 1877-79 (Nov. 1992).
A Stein et al., "Diffractive x-ray optics using production fabrication methods", J. Vac. Sci. Technol. B 21.1., Jan./Feb. 2003, 214-219.
K. Jefimov et al., "Fabrication of Fresnel zone plates for hard X-rays", Microelectronic Engineering 84 (2007) 1467-1470.
J. Reinspach et al., "13 nm high-efficiency nickel-germanium soft x-ray zone plates", J. Vac. Sci. Technol. B, vol. 29, No. 1, Jan./Feb. 2011,011012-1-011012-4.
C. David et al., "Nanofocusing of hard X-ray free electron laser pulses using diamond based Fresnel zone plates", Scientific Reports, (2011) 1: 57.
W. Yun et al., "Nanometer focusing of hard x rays by phase zone plates", Rev. of Sci. Instruments 70, 5, (1999), 2238-2241.
K. Keskinbora et al., "Ion beam lithography for Fresnel zone plates in X-ray microscopy", Optics Express, vol. 21, No. 10 (2013) 11747-11756.
K. Saitoh et al., "Characterization of sliced multilayer zone plates for hard x rays", Rev. of Sci. Instruments 60, 7, (1989), 1519-1523.
M.Yasumoto et al., "Suppression of Corrugated Boundaries in Multilayer Fresenel Zone Plate for Hard X-Ray Synchrotron Radiation using Cylindrical Slit", Japanese Journal of Applied Physics, 40, pp. 4747-4748.
H. Yan, et al., "Two dimensional hard x-ray nanofocusing with crossed multilayer Laue lenses", Optics express vol. 19, No. 16, (2011), 15069-15076.
S.M. George, "Atomic Layer Deposition: An Overview", Chem. Rev., 2010, 110 (1), pp. 111-131.
M. Mayer et al., "Multilayer Fresnel zone plate for soft X-ray microscopy resolves sub-39 nm structures", Ultramicroscopy 111 (2011) 1706-1711.
Z. Huang, "Metal-Assisted Chemical Etching of Silicon: A Review: In memory of Prot Ulrich Gösele", Adv. Mater. 2011, 23, 285-308.
Y. Oh, "Magnetically Guided Nano-Micro Shaping and Slicing of Silicon", Nano Lett. 2012, 12, 2045-2050.
K.-Y. Weng et. al. "Planarize the sidewall ripples of silicon deep reactive ion etching", NSTI-Nanotech 2004, www.nsti.org, ISBN 0-9728422-7-6 vol. 1, 2004).
J.D. Ferguson et al., "Atomic layer deposition of boron nitride using sequential exposures of BCl3 and NH3", Thin Solid Films 413 (2002) 16-25.
J.W. Elam et al., "Nucleation and growth during tungsten atomic layer deposition on SiO2 surfaces",Thin Solid Films 386 2001 41-52.
T. Aaltonen et al., "Atomic Layer Deposition of Iridium Thin Films",J. Electrochem. Soc. 2004, vol. 1, 8, pp. G489-G492.
S.-J. Ding et al., "Atomic layer deposition of high-density Pt nanodots on Al2O3 film using (MeCp)Pt(Me)3 and O2 precursors for nonvolatile memory applications", Nanoscale Research Lett, 2013, 8:80.
M. Born and E. Wolf, Principles of Optics, Sixth edition, Cambridge University Press, 1998, p. 381.
H.I. Smith, "A proposal for maskless, zone plate array nanolithography" J. Vac. Sci. Technol. B 14(6), Nov./Dec. 1996, pp. 4318-4332.
T. Salditt, et al., "X-Ray Optics on a Chip: Guiding X Rays in Curved Channels", Phys. Rev. Lett 115, (2015), 203902.
Chang, C., and Sakdinawat, A., "Ultra-high aspect ratio high-resolution nanofabrication for hard X-ray diffractive optics", Nature Communications, 5:4243 (2014) doi: 10.1038/ncomms5243; published Jun. 27, 2014.
Moldovan, Nicolaie A., "Batch Produced X-Ray Focusing Devices for 20-100 keV Photon Energies", Project Outcome Report for Federal Award ID No. 1648219, published Feb. 13, 2018, available online at Research.gov, NSF Award Highlights, Research Spending and Results, https://www.research.gov/research-portal/appmanager/base/desktop?_nfpb=true&_eventName=viewQuickSearchFormEvent_so_rsr.

\* cited by examiner

Fig. 16C  Ideal (kinoform) phase shifts

Fig. 16B  Phase variation for a 3-materials FZP

Fig. 16A  Cross section schematic for 3-materials FZP

Fig. 17C  Ideal (kinoform) phase shifts
Fig. 17B  Phase variation for a N-materials FZP
Fig. 17A  Cross section schematic for N-materials FZP Table 1

| Photon or Particle energy (keV) | Boron Nitride Coefficient of Index of Refraction $\delta_{BN}$ | Tungsten Coefficient of Index of Refraction $\delta_W$ | Iridium Coefficient of Index of Refraction $\delta_{Ir}$ | Platinum Coefficient of Index of Refraction $\delta_{Pt}$ | Height of the zone $h_{\pi\,W-BN}$ (μm) | Height of the zone $h_{\pi\,Ir-BN}$ (μm) | Height of the zone $h_{\pi\,Pt-BN}$ (μm) | Tungsten/ Boron Nitride Aspect Ratios $A_{\pi\,W-BN}$ | Iridium/ Boron Nitride Aspect Ratios $A_{\pi\,Ir-BN}$ | Platinum/ Boron Nitride Aspect Ratios $A_{\pi\,Pt-BN}$ |
|---|---|---|---|---|---|---|---|---|---|---|
| 10 | 4.22E-06 | 2.78E-05 | 3.41E-05 | 3.28E-05 | 2.6 | 2.1 | 2.2 | 526 | 414 | 434 |
| 30 | 4.68E-07 | 3.55E-06 | 4.11E-06 | 3.93E-06 | 6.7 | 5.7 | 6.0 | 1342 | 1134 | 1195 |
| 50 | 1.69E-07 | 1.26E-06 | 1.47E-06 | 1.40E-06 | 11.3 | 9.6 | 10.1 | 2266 | 1911 | 2012 |
| 100 | 4.21E-08 | 3.19E-07 | 3.69E-07 | 3.52E-07 | 22.4 | 19.0 | 20.0 | 4479 | 3792 | 4003 |
| 200 | 1.05E-08 | 7.98E-08 | 9.24E-08 | 8.82E-08 | 44.8 | 37.9 | 39.9 | 8951 | 7570 | 7978 |

Fig. 21

BATCH-PROCESSING METHOD FOR SUPER-HIGH ASPECT RATIO DIFFRACTIVE OPTICS

CROSS REFERENCE TO RELATED APPLICATION

This application claims priority from U.S. Provisional patent application No. 62/302,352, filed Mar. 2, 2016, entitled "Batch-Processing Method for Super-High Aspect Ratio Diffractive Optics", which is incorporated herein by reference in its entirety.

FIELD OF THE INVENTION

This invention relates to a method of manufacturing high aspect ratio diffractive optic devices applicable to the focusing or shaping of wave fronts of very high energy electromagnetic radiation or particle beams using curved or variable-spaced diffractive lines of absorber or phase shifter materials, with sub-20 nm features and aspect ratios up to tens of thousands to one.

BACKGROUND

Many diffractive optics devices, such as those used for focusing X-rays or particle rays (elementary particles or ions), use high-aspect-ratio or free-standing curved or variable-width line grids, or, they are composed of a succession of absorption or refractive index varying absorber or phase shifter materials to manipulate the wave front through superposition of beams diffracted by individual design features of the devices. In many cases, such design features are organized in curved or straight lines of variable spacing. The phrase "diffractive lines" will be used herein to describe the diffractive elements of such devices. For some geometries, the diffractive lines may alternatively be referred to as diffractive zones. A typical example of this type of structure is a Fresnel Zone Plate (FZP) for focusing X-rays, in which the diffractive lines are organized in concentric circles, which may be referred to as zones. The width of the absorber/phase shifter material lines (zones) is varied in proportion to the square root of the radius of curvature of the lines, usually from widths of a few micrometers at the center of the FZP, to a few tens of nanometers or less at the outermost zones. The characteristic performance metrics of such devices, such as focusing resolution, diffraction efficiency, spectral resolution, or other metrics, depend on the linewidth control and fidelity of the smallest dimension diffractive lines/zones and the thickness in the propagation direction of the diffractive lines, as achievable technologically. For instance, the focusing resolution of FZPs is related to the width of the outermost circular zone, while the efficiency—defined as the energy of the beam diffracted towards the focus of interest divided by the total incident beam energy—depends on the thickness and nature of the material, as well as the accuracy of the zone pattern. It is well-known to those skilled in the art that the maximum theoretical efficiency of binary FZPs can be obtained if the phase shift difference in adjacent zones is a multiple of pi ($\pi$). For high photon energy X-rays such as 25 keV, the necessary thickness of a $\pi$-shifting material is about 4.84 $\mu$m for gold, 4.5 $\mu$m for tungsten, and 4.2 $\mu$m for iridium. If the smallest zone width is 20 nm, then the aspect ratios of such diffractive lines are 242:1, 225:1, and 210:1, respectively. Self-standing geometric objects of this aspect ratio are essentially impossible to fabricate without collapse or distortion at this time. If a material scaffold of low absorption/low refractive index is used to prevent collapse, the phase shift produced in that material has to be considered and the aspect ratio needed for a phase shift difference of $\pi$ between adjacent diffractive lines increases even more. Also, if applications are envisioned for higher photon energies, such as 20-100 keV, where X-ray producing tubes/lamps generate higher intensities due to the energy proximity of spectral absorption/emission edges of most metallic cathode electrodes of interest (including the refractory metals well-suited for X-ray emission cathodes), the aspect ratio requirements of the corresponding diffractive lines increases dramatically up to tens of thousands-to-one. The use of small laboratory-based X-ray sources such as X-ray tubes is preferable to sources such as those of expensive synchrotron radiation facilities, to allow for lower cost/smaller footprint generation of X-rays in small X-ray microscopes or diffraction devices, which then require adequate diffraction optics of super-high aspect ratios. Recently, D. Habs et al. (D. Habs et al., Phys. Rev. Lett. 108, (2012) 184802) demonstrated that the refractive indexes of materials in the gamma ($\gamma$)-ray regime (photon energies from 0.18 MeV to 2 MeV) can attain values in the $10^{-9}$-$10^{-5}$ range due to inelastic Delbrück scattering or pair creation, thus allowing for the possibility of the fabrication of diffractive optics for $\gamma$-rays, if super-high aspect ratio structures can be reliably fabricated. Thus, there exists a need for a method of greatly improving the manufacturability of high aspect-ratio diffractive optics devices comprised of appropriate phase shifting materials which are capable of addressing one or more limitations of known methods.

Several methods of manufacturing diffractive optics of high aspect ratio have been proposed and practiced. The most common manufacturing method of limited high aspect ratio diffractive optics is the use of electron beam lithography for writing the diffractive lines into an electron-beam-sensitive resist material, followed by electroforming a metal using the said resist as a mold, as taught by B. Lai et al. (B. Lai et al., Appl. Phys. Lett. 61, 1877 (1992)). Electron beam lithography followed by the etching of the substrate and filling the so-obtained mold with a metal by electroplating is also known, as taught, for example, by A. Stein et al. for the case of etching the structure into silicon (A. Stein et al., J. Vac. Sci. Technol. B 21.1., January/February 2003, 214-219), or K. Jefimov et al. for the case of polyimide (K. Jefimov et al., Microelectronic Engineering 84 (2007) 1467-1470), or J. Reinspach et al. for germanium (J. Reinspach et al., J. Vac. Sci. Technol. B, Vol. 29, No. 1, January/February 2011, 011012-1-011012-4), or C. David et al. for diamond (C. David et al., Scientific Reports, (2011) 1: 57). Electron beam lithography can be replaced by other types of lithography, such as, X-ray, ion beam, focused ion beam or particle beam lithography, followed by etching and/or electroplating (W. Yun et al., Rev. of Sci. Instruments 70, 5, (1999), 2238-2241; and K. Keskinbora et al., Optics Express, Vol. 21, No. 10 (2013) 11747-11756). The limitations of all these types of lithography and methods are the modest aspect ratios of the features that they are capable of producing. These prior art methods usually achieve an aspect ratio of 10:1, and only a few exceptions can reach aspect ratios close to about 20:1. These aspect ratios are insufficient for efficient focusing of x-rays, or particle beams of a corresponding energy.

To overcome the aspect ratio limitation in various lithographic technologies, a method of producing diffractive optics of circular symmetry, called "sputter-and-slice" was proposed by K. Saitoh et al. (K. Saitoh et al., Rev. of Sci.

Instruments 60, 7, (1989), 1519-1523). The method begins with a wire, rod, or tube, of circular cross-section, followed by deposition of a succession of alternating layers of material having different characteristics, i.e., alternating low absorbing/high absorbing material layers, or, alternating low refractive index/high refractive index material layers. Layers are deposited by sputtering from different targets in the same vacuum chamber, with rotation of the wire around its axis. The deposition times and conditions are calculated such that the thicknesses of the successively deposited layers are equal to the diffractive line width of a given position in the targeted device. Finally, the wire is sectioned and polished to form the diffractive device, such as, a Fresnel zone plate. One drawback of this method is the accentuation or amplification of radius irregularities of the central wire (i.e. the roughness or accidental other variations including particulate defects and thickness variations during the deposition) as successive layers are deposited beginning from the bare wire and proceeding to the outermost layer. A second drawback is the accumulation of the absolute error values of the depositions thicknesses of each of the inward layers as an error of placement of the next outward layer. Thus, the outermost (i.e. thinnest) layers accumulate the largest radius errors due to the amplification and accumulation of the depositional processes errors through successive layers. This error amplification process can produce defects in the final (thinnest) zone shape and placement exceeding a half-width of the layer/zone itself, rendering that portion of the diffractive line useless for focusing or adequate manipulation of phase shift of the prescribed photon or particle beam. Improvements of the sputter-and-slice method have been proposed by M. Yasumoto et al., (M. Yasumoto et al., Japanese Journal of Applied Physics, 40 (2001), pp. 4747-4748), in which the sputtering of layers onto the rotating wire is performed through a narrow slit, to minimize the roughness accentuating phenomenon. However, in order to effectively reduce the error amplification process, the slit widths have to be reduced to fractions of the wire diameter, which reduces the deposition rate to impractically low values. Another drawback of the sputter-and-slice method is that only one wire can be processed at a time, while the slicing/polishing procedures are serial and time-consuming.

A linear form of the sputter-and-slice method has been developed for one dimensional focusing lenses, in which a planar substrate is sputter-deposited with successive layers of designed thickness by moving the planar substrate below sputtering targets and then slicing and using the slices grouped in a symmetrical pair as linear focusing lenses, called Multi-Layer Laue Lenses (MLLs) (H. Yan, et al., Optics express Vol. 19, No. 16, (2011), 15069-15076). The method suffers from the same drawbacks as the wire-based version and can be used only for linear (one-dimensional) optics; however, it has shown relatively higher rates of success because it is easier to obtain highly planar and smoothly-polished planar surfaces rather than perfectly circular, low roughness wires or tubes.

An alternative version of the sputter-and-slice method has been developed in which the directional sputtering process onto wires is replaced by atomic layer deposition (ALD), onto wires. ALD is by nature, a highly isotropic deposition process (see review by S. M. George, *Chem. Rev.*, 110 (1), (2010), pp 111-131). The method, reported by M. Mayer et al. (M. Mayer et al., Ultramicroscopy 111 (2011) 1706-1711), which is known as "ALD-and-slice", eliminates the roughness accentuation of the sputter-and-slice method and even produces a smoothing with succeeding depositions, does not require a rotation setup in the deposition chamber, and permits deposition onto several wires at the same time. However, this method still preserves error accumulation in layer thicknesses, but these errors are more easily kept in control, due to the more precise nature of the ALD process. A version of the ALD-and-slice method, in which successive layers are deposited into the inner cavity of a capillary tube, rather than onto a wire, was proposed by G. Schuetz et al., (U.S. patent application No. 2012/0258243 A1). This method alleviates the problem of error accumulation in the thinnest (top most) layers, since the thicker layers are deposited last, when the accumulated error is higher, but those thicker layers are also more shape and placement tolerant (in absolute values), thus, diminishing the percentage of thickness of accumulated error in the last (thicker) layers/zones. All the versions of the sputter and slice and ALD-and-slice methods preserve the drawbacks of a serial and tedious slicing and polishing procedure. An additional drawback of the ALD-and-slice method is the relative slow rate of deposition in ALD processes, which require months-long deposition times for Fresnel Zone Plates with a reasonable number of zones.

A related method was proposed by W. Yun et al. (U.S. Pat. No. 7,365,918 B1) comprising etching a cylindrical hole into a substrate and sequentially depositing layers corresponding in thickness to zone plate zones, by sputtering or ALD, and then slicing by polishing to form zone plates. In practice, for deposition by sputtering, this fabrication process would be limited by the variation of thickness of sputtered layers with the depth in the hole, inherent to the sputtering process. As mentioned above, while sequential ALD is capable of deposition of conformal layers of uniform and controlled thickness, in practice, the method of Yun et al. would be limited by the surface roughness of the cylindrical holes, which depends on the etch process used for etching the holes. For example, a deep reactive ion etching process (DRIE), such as the Bosch etch process, which is used to etch high aspect-ratio, deep, holes for microelectronics or MEMS devices, is known to create sidewall ripples, or "scalloping" of the sidewalls. Thus, the thickness of the thinnest functional zone of the diffractive optic is limited by the average roughness of the side walls, which is usually tens or hundreds of nm for most etching processes. Moreover, this method would need an accurate characterization of the diameter, sidewall tilt and surface roughness of the cylindrical hole, e.g., an accuracy of no less than half of the thinnest targeted functional zone width, which is typically ~10 nm or less. This accuracy is difficult to characterize in holes of the required depth and aspect ratio, except by destructive procedures.

Thus there is a need for improved device structures and methods for fabrication of high aspect ratio diffractive optics, which address one or more of the above mentioned limitations of known device structures and methods.

SUMMARY OF INVENTION

Aspects of the present invention provide device structures comprising diffractive optics and methods of fabrication thereof. Device structures and methods of preferred embodiments are disclosed, which have particular application batch-processing of high-aspect ratio diffractive optics for X-rays and gamma rays up to hundreds of keV and particle beams of corresponding energies.

One aspect of the invention provides a method for fabrication, by batch-processing, of a plurality of device structures comprising a high aspect-ratio diffractive optic having a specified diffractive line pattern for photons or particle beams of a prescribed wavelength or energy, comprising:

providing a first substrate having a planar front surface and back surface;

performing an anisotropic etch process comprising patterning of the front surface of the substrate and removal of material of the substrate to define a precursor structure comprising an array of a plurality of precursor forms comprising one of:
- a) mesas having sidewalls of predetermined vertical and lateral dimensions and sidewall angle;
- b) mesas within holes or trenches, the mesas having sidewalls of predetermined vertical and lateral dimensions and sidewall angle; and
- c) a combination of thereof;

smoothing sidewalls of the mesas to a predetermined sidewall surface roughness;

depositing thereon a sequence of layers defining the specified diffractive line pattern comprising a plurality of m layer stacks, each layer stack comprising at least a pair of layers comprising a layer of a first material (M1) and a layer of a second material (M2), said layer stacks (M1, M2) being deposited by an isotropic deposition process providing conformal layers of controlled layer thicknesses on sidewalls of each mesa in sequence $(M1, M2)_1$, $(M1, M2)_2, \ldots (M1, M2)_m$, each of said first and second materials having a different selected complex refractive index, said step of depositing comprising controlling the layer thickness of each pair of layers (M1, M2) of the sequence of m layer stacks on sidewalls of each mesa to define diffractive lines of the specified diffractive line pattern for the diffractive optics, wherein each mesa forms a core of one of the diffractive optics;

after forming the sequence of layers, providing a planarization layer thereon filling remaining surface voids;

performing a first planarization to remove parts of the planarization layer and the sequence of layers and exposing a planarized front-side surface comprising a first surface of each mesa, of the diffractive lines around each mesa and surrounding parts of the planarization layer and the first substrate;

performing a second planarization to thin the backside of the first substrate and remove part of the first substrate and the sequence of layers to provide a planarized back-side surface exposing a second surface of each mesa, of the diffractive lines around each mesa and the first substrate;

wherein, for photons or particles of the prescribed wavelength or energy, an axial height h between the first surface and second surface of each of the diffractive lines of each diffractive optic, in the direction of propagation, provides at least one of:
- a required absorption difference between adjacent diffractive lines,
- a phase shift difference of $\pi$ between adjacent diffractive lines, and
- a phase shift difference of a designed (specified) fraction of $\pi$ between adjacent diffractive lines;

and wherein the aspect ratio of the axial height h and the layer thickness of a thinnest layer of the sequence of layers of the diffractive line pattern is greater than 10:1.

The precursor forms may be structured to provide two-dimensional and one-dimensional (linear) diffractive optics. For example, for two-dimensional diffractive optics, the mesas may comprise cylindrical columns, or tapered columns, or other forms such as pillars, pedestals, et al. Each mesa may be formed within a surrounding recess, such as a cylindrical hole. For one-dimensional, or linear, diffractive optics, the mesas may comprise linear ridges, rectangular or square mesas, with vertical sidewalls or sidewalls with a selected sidewall angle, formed within trenches.

The step of smoothing sidewalls of the mesas to provide the precursor forms having sidewalls with a predetermined surface roughness comprises, prior to depositing the sequence of layer of M1 and M2, providing a sidewall smoothing layer, the sidewall smoothing layer having an RMS surface roughness of a designed fraction of the thickness of the thinnest layer of the sequence of layers of M1 and M2 of the diffractive line pattern. Preferably, the RMS surface roughness of the smoothing layer is no greater than half of the thickness of the thinnest layer.

For example, providing a smoothing layer may comprise depositing a conformal layer of a reflowable material and heat treating the reflowable material to reduce surface roughness through capillary action. Providing a smoothing layer alternatively comprises depositing a first layer of a smoothing material having a thickness that is greater than the peak to peak surface roughness of the sidewall of the precursor form, and optionally heat treating or chemically treating the smoothing layer, to reduce surface roughness, for example, to provide an RMS surface roughness of $\leq 10$ nm, or more preferably $\leq 1$ nm.

In a preferred embodiment, the step of depositing of at least thinner layers of the sequence of layers comprises Atomic Layer Deposition. Since ALD deposition works by flushing alternatively a precursor gas or vapor and a reactive gas or vapor into the reactor chamber to allow for a monolayer or fraction of monolayer growth, the deposition thickness can be conveniently and accurately controlled by counting the number of flushing sequences. This method allows for an accurately controlled deposition to control the thickness of each layer of the sequence of M1, M2 layers, which may have thicknesses typically in the range from 0.1 nm to 100 nm thick or higher, as limited by reasonable deposition times. Optionally, the step of depositing may further comprise Chemical Vapor Deposition (CVD) for deposition, e.g. for depositing of at least some of the thicker layers of the sequence of layers.

The step of performing the first planarization may comprise any one of mechanical polishing, chemical polishing, chemical-mechanical polishing, ion beam polishing and a combination thereof.

In an embodiment, after performing the first planarization, the method further comprises attaching a carrier substrate to the planarized first surface of the first substrate; and then performing the second planarization for removing at least part of the first substrate (substrate thinning) to expose a second surface of each of the diffractive line patterns, thereby producing an array of a plurality of diffractive optics supported by remaining parts of the first substrate and the carrier substrate.

The step of performing the second planarization may comprise any one of grinding, mechanical polishing, chemical polishing, chemical-mechanical polishing, ion beam polishing and a combination thereof.

In an embodiment with a carrier substrate, removing at least part of the carrier substrate, to expose the first surface of each of the diffractive line patterns, comprises opening a plurality of windows in the carrier substrate aligned to each of the plurality of diffractive optics of the array or groups thereof.

Optionally, the carrier substrate is bonded to the planarized first surface with at least one intermediate layer, and removing at least part of the carrier substrate to expose the first surface of each of the diffractive line patterns comprises opening windows in the carrier substrate aligned to each diffractive optic to expose said intermediate layer, the at least one intermediate layer acting as a membrane support for each diffractive optic.

The method may further comprise providing one or a plurality of additional layers on one or both of the front and back sides (i.e. first and second surfaces) of each diffractive optic, comprising any one of: providing one or more support layers or stress reduction layers for improved mechanical properties; providing one or more thermal dissipation layers; providing one or more electrically conductive layers; providing a separation layer for constructing other planar optical devices atop of the diffractive device; and a combination thereof.

The method optionally comprises post-processing by any one of ion implantation, etching or heat treatment for at least one of: reshaping, trimming, stress engineering, adjusting functionality and fine tuning of optical properties of the diffractive optics.

The first substrate comprises, for example, a large diameter silicon wafer, which is polished on at least the front side, and which enables for fabrication of an array of a large plurality of diffractive optics by standard batch processing of a set of wafers, e.g. to form tens or hundreds of diffractive optics elements on each wafer. After completion of the above mentioned fabrication steps, the method further comprises a step of device singulation, e.g. wafer dicing or cleaving, to form individual device structures (chips) comprising one or more diffractive optical elements on each chip.

Fabrication of the high aspect ratio diffractive optics on a standard silicon wafer, by adaptation of conventional semiconductor processing technologies, is compatible with further processing for integration of other optical and electronic components on the same substrate for more complex functionalities.

When the diffractive line pattern comprises a sequence of first and second materials M1 and M2, by way of example, the first material M1 comprises: at least one of platinum, iridium, tungsten, rhodium, osmium, zinc oxide, titanium oxide, hafnium oxide and compounds, alloys or mixtures thereof; and the second material M2 comprises: at least one of boron nitride, carbon, silicon dioxide, silicon nitride, aluminum oxide and compounds, or mixtures thereof. The alternating layers of M1 and M2 form a binary diffractive optic.

In some embodiments the sequence of layers comprises a sequence of m layer stacks, wherein each layer stack comprises N layers of materials M1, M2, ... MN, where N is ≥3, the materials M1, M2, ... MN having an ordered sequence of different complex indexes of refraction at the prescribed wavelength or energy, the sequence of layers being deposited to form the sequence of m layer stacks (M1, M2, ... MN)$_1$ (M1, M2, ... MN)$_2$, ... (M1, M2, ... MN)$_m$ with specified layer thicknesses to define an Nth order diffractive optic.

By appropriate selection of the diffractive line pattern, the materials M1 ... MN, and dimensions of the diffractive optics, high aspect ratio, one or two dimensional diffractive optics can more readily be fabricated for focusing or shaping of wavefronts of x-ray or gamma-ray electromagnetic radiation having a prescribed wavelength energy in the range from ~1 keV to hundreds of keV. The present method is particularly applicable for high aspect ratio diffractive optics for energies in the range above 5 keV, e.g. 8 keV to 100 keV or more. At lower energies, where a high thickness of the absorber/phase shifter materials is not required, other known methods of fabrication may be applicable, but the methods disclosed herein still offer the advantage of an easy way to obtain fine zones in the sub-20 nm zone widths domain. For higher energies, embodiments of the methods disclosed herein are particularly applicable to provide for batch fabrication of high aspect ratio and ultra-high aspect ratio diffractive optics for photons or particle beams of higher energies corresponding to hard x-rays or gamma rays, e.g. several hundred keV.

By way of example, to provide high aspect ratio two dimensional diffractive optics structures, defining the precursor structure wherein each mesa comprises a cylindrical column; and wherein each cylindrical column comprises: a diameter in the range from a few micrometers to a few hundreds of micrometers, sized to form a core for the sequence of layers defining the diffractive zone pattern; a side wall angle not more than 5 degrees from vertical, and preferably within 0.5 degrees of vertical; a height between 1 μm and 200 μm, such that after planarization, resulting diffractive optic has the axial height h, the thickness of the thinnest layer of the sequence layers is between 0.2 and 100 nm; and wherein the aspect ratio of said axial height h to said thickness of the thinnest layer is between 20:1 and 100,000:1

Preferably each precursor column is formed within a surrounding recess, such as a cylindrical hole, and each recess is surrounded by a reinforcing region of the substrate, to provide robustness during polishing or other planarization processes. The spacing between sidewalls of the recess or hole and the sidewalls of the column facilitates measurement of the precursor after their fabrication in terms of size, sidewall slope, and surface roughness. The recess or hole also provides that each column is spaced from and surrounded by a surface region of the first substrate to act as a robust etch stop and facilitate subsequent polishing steps. The columns may have substantially vertical sidewalls, e.g. side wall angle of not more than 0.5 degrees, or may have a specified side wall angle, e.g. 5 degrees or other specified angle. A large number of precursor forms can readily be defined in first substrate comprising a silicon wafer, using a sequence of conventional fabrication steps such as reactive ion etching.

In another embodiment, for fabricating linear diffractive optics, each mesa comprises a linear ridge; and wherein: each linear ridge comprises: a width in the range from few micrometers to hundreds of micrometers and length from tens of micrometers to a few millimeters, sized to form a core for the sequence of layers defining the diffractive line patterns; a height between 1 μm and 200 μm, such that after planarization, the resulting diffractive optics have the required axial height h; the thickness of thinnest deposited layers of the sequence layers is between 0.2 and 100 nm; and wherein the aspect ratio of said axial height h to said thickness of the thinnest deposited layers is between 20:1 and 100,000:1.

Preferably each ridge is formed within a surrounding trench. Each ridge may have substantially vertical sidewalls, e.g. a sidewall angle of not more than 0.5 degrees. In some embodiments, each ridge has a sidewall angle along its length not greater than 5 degrees from vertical. Alternatively, for some applications, a greater sidewall angle is required, and each ridge has tapered sidewalls, having a predefined sidewall angle α with respect to the wafer plane, along its length.

Another aspect of the invention provides method of fabrication, by batch processing, of a plurality of device structures comprising a high aspect-ratio diffractive optic, for photons or particle beams of a prescribed wavelength or energy, comprising:

providing a first substrate having a planar front surface and back surface;

performing an anisotropic etch process comprising patterning of the front surface of the substrate and removal of material of the substrate to define a precursor structure comprising an array of a plurality of precursor forms comprising one of:
  a) for two dimensional diffractive optics, high aspect ratio cylindrical holes having sidewalls of predetermined vertical and lateral dimensions and sidewall angle;
  b) for one-dimensional diffractive optics, high aspect ratio linear trenches having sidewalls of predetermined vertical and lateral dimensions and sidewall angle; and
  c) a combination thereof;

smoothing sidewalls of the holes or trenches to a predetermined sidewall surface roughness; depositing thereon a sequence of alternating layers of at least a first material (M1) and a second material (M2) having respective first and second (different) complex indexes of refraction at the prescribed energy or wavelength, said layers of first and second materials being deposited by an isotropic deposition process to provide an alternating sequence of conformal layers of the at least the first and second materials on sidewalls of the precursor forms;

said step of depositing comprising controlling the thicknesses of each of the layers of the sequence of layers on sidewalls of each mesa of the precursor structure to form diffractive line patterns for the diffractive optics for said photons or particle beam of the prescribed wavelength or energy; and said step of smoothing sidewalls of the holes and trenches to a predetermined sidewall surface roughness comprises smoothing sidewalls to an RMS surface roughness of a fraction of the thickness of the thinnest deposited layer(s) of the sequence of layers M1 and M2;

after forming the sequence of layers, providing a planarization layer thereon filling remaining surface voids;

performing a first planarization to remove parts of the planarization layer and the sequence of layers and exposing a planarized front-side surface comprising a first surface of each of the diffractive line patterns and surrounding parts of the first substrate;

performing a second planarization to thin the backside of first substrate and remove part of the first substrate and the sequence of layers to provide a planarized back-side surface exposing a second surface each of the diffractive line patterns;

wherein, for photons or particle beams of the prescribed wavelength or energy, an axial height h between the first surface and second surface of each of the diffractive line patterns of the diffractive optic, in the direction of propagation, provides at least one of:
  an absorption difference between adjacent diffractive lines,
  a phase shift difference of $\pi$ between adjacent diffractive lines, and
  a phase shift differences of a designed fraction of $\pi$ between adjacent diffractive lines;

and wherein the aspect ratio of the axial height h and the thickness of a thinnest layer of the sequence of layers of the zone pattern is greater than 10:1. In an embodiment, smoothing sidewalls of the holes or trenches to a predetermined sidewall surface roughness comprises, prior to depositing the sequence of layer of at least layers M1 and M2, providing a sidewall smoothing layer, the sidewall smoothing layer having an RMS surface roughness no greater than a fraction of the thickness of a thinnest layer of the sequence of layers of M1 and M2 of the diffractive line patterns.

The high aspect ratio holes may be cylindrical holes or tapered holes for formation of two dimensional diffractive optics, square or rectangular trenches for formation one-dimensional (linear) diffractive optics.

When the precursor structure comprises cylindrical holes or linear trenches, they have a respective diameter or lateral dimension, after providing the smoothing layer on sidewalls of the cylindrical hole, which is sized to contain the sequence of layers defining the diffractive line pattern. In some embodiments, the side wall angle (tilt) of the cylindrical holes is not greater than 5 degrees, preferably <0.5 degrees or substantially vertical; the depth of the cylindrical holes is between 1 µm and 200 µm, such that after planarization, the resulting diffractive optic has an axial dimension h (i.e. an axial height or distance), in the direction of propagation that provides a phase propagation difference between adjacent zones, of a photon or particle beam that is a multiple of $\pi$, or a sufficient or designed fraction of $\pi$; the thickness of first deposited layers of the sequence layers is between 0.2 and 100 nm; the aspect ratio of said axial height h to said thickness of the first deposited layers between 20:1 and 100,000:1.

Another aspect of the invention provides a diffractive optics device structure comprising at least one diffractive optical element for photons or particle beams of a prescribed wavelength or energy, fabricated by a method as disclosed herein, wherein:

for photons or particle beams of the prescribed wavelength or energy, the at least one diffractive optical element has an axial height h between a first surface and a second surface of each of the diffractive line patterns of the diffractive optic, in the direction of propagation, which provides at least one of:
  an absorption difference between adjacent diffractive lines,
  a phase shift difference of $\pi$ between adjacent diffractive lines,
  a phase shift difference of a designed fraction of $\pi$ between adjacent diffractive lines;

and wherein the aspect ratio of the axial height h and the thickness of a thinnest layer of the sequence of layers of the zone pattern is greater than 10:1.

For example, the thickness of thinnest deposited layers of the sequence layers is between 0.2 and 100 nm; the aspect ratio of said axial height h to said thickness of the first deposited layers between 10:1 and 100,000:1.

The at least one diffractive optical element may comprise a two dimensional diffractive optical element, or a one dimensional (linear) diffractive optical element, or a mixture of one and two dimensional diffractive optics.

The device structure may comprise a binary diffractive optical element comprising a sequence of alternating layers of materials M1 and M2. The device structure may comprise a sequence of layers M1, M2 . . . MN, where N is ≥3, the materials M1 . . . MN having an ordered sequence of different complex indexes of refraction at the prescribed energy or wavelength, thereby forming an Nth-order diffractive optic, with the sequence of layers being deposited in a repeating sequence M1, M2, . . . MN, form a higher order diffractive optic.

The diffractive line patterns, and the materials and dimensions of the diffractive optics may be selected for focusing of x-ray or gamma-ray electromagnetic radiation having a prescribed energy, e.g. a selected energy in the range from 5 keV to several hundred keV.

In summary, methods according to embodiments of the present invention overcome at least some limitations of conventional ALD-and-slice methods, which are based on a sequential atomic layer deposition method on wires and inside capillaries. In particular, the disclosed methods provide for a batch process executable at wafer scale. Batch processing is achieved by providing precursor structures, i.e. forms or patterns, etched into a planar substrate, such as a large diameter silicon wafer, and processing a batch of a large plurality of diffractive optic structures by the wafer, and/or several wafers at a time ("wafer batch") up to singulation. A sequence of method steps are used to create a precursor structure comprising an array of a plurality of precursor forms such as columns, or columns within holes, or holes. After sidewall smoothing, the precursor structures are sequentially coated with a sequence of ALD layers, M1 . . . MN, of controlled thicknesses defining diffractive layers or zones, to create an array of a large number of diffractive optics on each wafer. Conventional slicing of individual wires or capillaries is replaced by wafer thinning and planarization techniques, such as chemical mechanical polishing, followed by device singulation, e.g. by dicing or cleaving, to produce a batch of large number of individual device structures e.g. fabricated as membranes carrying one or more diffractive optics.

For example, a preferred embodiment of a method for fabricating Fresnel zone plates disclosed herein overcomes at least some disadvantages of the conventional ALD-and-slice method, by replacing wires or hollow tubes with arrays of a plurality of precursor forms, e.g. cylindrical columns or cylindrical holes, or cylindrical columns within cylindrical holes, etched in a planar substrate, such as a silicon wafer. Using cylindrical columns to deposit the sequential layers around them has the advantage of enabling a better characterization of the side wall roughness and tilt of the columns versus cylindrical holes. Using cylindrical columns within concentric cylindrical holes provides a surrounding region of the substrate which confers robustness to the column structures for withstanding mechanical polishing. Formation of precursor structures and deposition of sequential layers by ALD is followed by standard batch-processing methods, to replace the conventional tedious serial slicing and individual wire polishing processes with mature and rapid wafer-level processing. This approach allows for parallel processing of hundreds of devices at a time at the wafer level, with processes common through-out the electronics and MEMS industry. The limitations of the disclosed process reside primarily in the accuracy of producing the initial precursor structures (e.g. cylindrical columns, cylindrical columns within cylindrical holes, or other precursor forms or precursor structures disclosed herein) and in controlling the thicknesses in the sequenced layer deposition, practically, in the 1 nm to 100 nm range. The innovative process sequence allows for device thicknesses limited in practice primarily by the fabrication process height limits of columns and holes in semiconductor substrates, which are typically in the range from a fraction of a μm to hundreds of μm. This translates into potential aspect ratios for the resulting zone plate lines of up to tens of thousands or even hundreds of thousands to one.

For example, the focussing efficiency of the resulting diffractive optic comprising a zone plate depends on factors including the aspect ratio, the amount of phase shift, which is preferably π, or close to π, provided between adjacent zones, and the quality of the execution of the zone plate structure. Smoothing of sidewalls of the precursor forms prior to deposition of the sequence of layers of the diffractive line pattern improves the quality of execution of the diffractive line patterns. That is, since any initial roughness or non-uniformity of surfaces of the precursor forms are propagated in successively deposited layers, smoothing of surfaces of the precursor form allows for closer control of the thickness and uniformity of the deposited sequence of layers forming the specified diffractive line pattern of the zone plate.

The disclosed methods and device structures are particularly applicable to diffractive optical elements, such as a high resolution Fresnel Zone Plate of ultra-high aspect ratio (up to tens of thousands to one) for focusing of hard X-rays or gamma-rays with energies up to hundreds of keV, with zone widths down to few nanometers or less, and thicknesses of a few to tens of micrometers. Fabrication on a semiconductor substrate, such as a silicon wafer, enables integration or mounting of other optical and electrical components on the same substrate.

Optional post-processing is possible and can lead to enhancement of the mechanical, thermal, and electrical properties of the devices, or can be used to fine tune their optical properties. The method can be readily generalized for multilayer stacks of ALD films, M1, M2 . . . MN, to approach a smooth variation of absorbance and of phase shifting across Fresnel zones, for an increase in efficiency and the elimination of unwanted focusing and diffraction orders.

The foregoing, and other objects, features, aspects and advantages of the present invention will become more apparent from the following detailed description, taken in conjunction with the accompanying drawings of preferred embodiments of the invention, which description is by way of example only.

BRIEF DESCRIPTION OF THE DRAWINGS

FIG. 21 shows a table (Table 1) of parameters, comprising photon or particle energy, index of refraction, zone height h and aspect ratio, for some examples of materials M1 and M2.

DETAILED DESCRIPTION OF EMBODIMENTS

Figure 5:
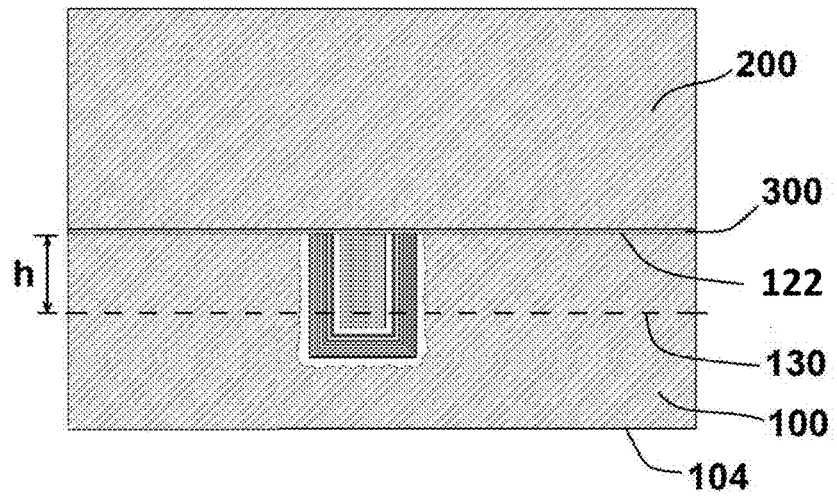
FIG. 5 shows a schematic vertical cross-sectional view through the device structure of FIG. 4 after bonding of a carrier substrate 200 to the initial substrate 100, using an intermediate layer 300.
Figure 6:
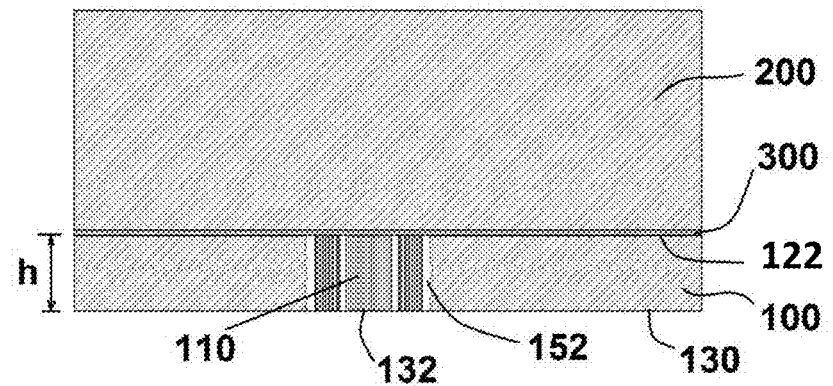
FIG. 6 shows a schematic vertical cross-sectional view through the device of FIG. 5, after a second planarization process to thin the first substrate and form a flat surface 130 exposing a core of material 110 surrounded by zones of M1 and M2.
Figure 7:
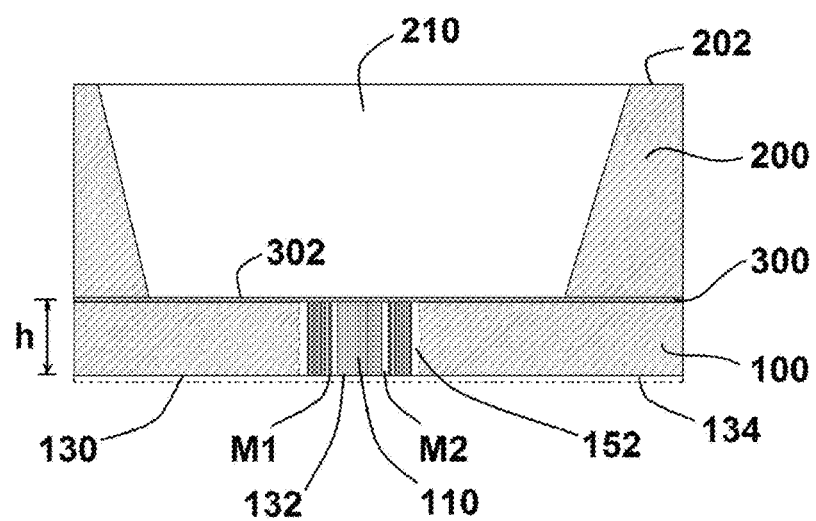
FIG. 7 shows a schematic vertical cross-sectional view through the device structure of FIG. 6, after opening a window 210 from the back side in the material of the carrier substrate 200, with an etch stop at the surface 302 of the bonding layer 300, to form a membrane-based diffractive optical device.

FIGS. 1A and 1B and FIGS. 2 to 7 illustrate schematically steps in a method of fabricating a device structure comprising a high aspect ratio diffractive optic according to a first embodiment, comprising a Fresnel Zone Plate (FZP). The resulting device structure is shown in FIG. 7.

Figure 1A:
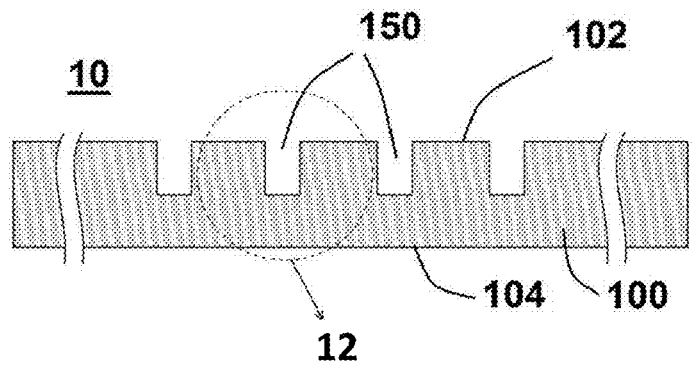
FIG. 1A shows a schematic vertical cross-sectional view through part of a device structure according to the first embodiment, wherein the precursor structure comprises an array of cylindrical holes 150 etched in a substrate 100.
Figure 1B:
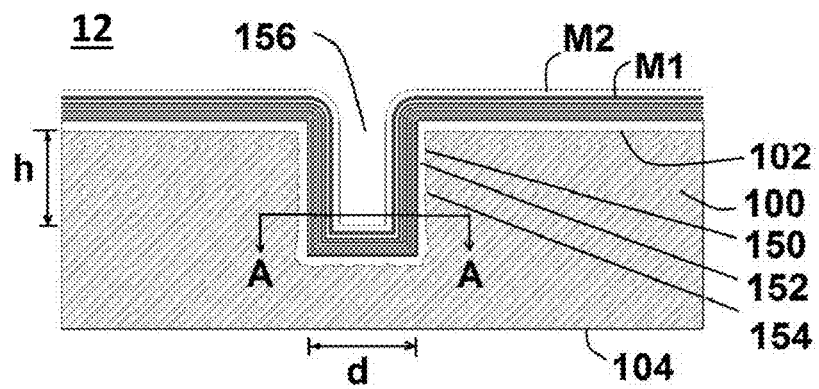
FIG. 1B shows an enlarged view of part of FIG. 1A following sequential deposition of a smoothing layer and an alternating sequence of a plurality of material layers M1 and M2 to form a sequence of conformal layers within each cylindrical hole, defining zones of a Fresnel Zone Plate.

FIG. 1A shows a schematic cross-sectional view part of a precursor device structure 10 comprising an array of cylindrical holes 150 defined in a planar substrate 100. The planar substrate comprises, for example a silicon wafer having a smooth polished planar front surface 102 and back surface 104. FIG. 1B shows an enlarged view of part 12 of FIG. 1A, comprising one of the array of cylindrical holes 150, after deposition of a planarization layer 152 and a sequence of conformal layers comprising a first material M1 and a second material M2 have been deposited in the cylindrical hole. As illustrated schematically, there are alternating layers of M1 and M2. The electromagnetic properties of each of first and second materials M1 and M2, e.g. refractive index and/or absorption, and the thicknesses of each layers are selected to form a FZP for electromagnetic radiation or particle beams of a predetermined energy, e.g. for X-rays. After etching of the cylindrical hole 150, and prior to depositing the alternating layers of M1 and M2 of the zone plate, a smoothing layer 152 is provided on sidewalls of the cylindrical hole 150, for reasons explained below. Thus, in transverse cross-section through plane A-A, the resulting device structure comprises a series of concentric rings of alternating layers M1 and M2, as illustrated schematically in FIG. 2, surrounding a central hole or opening 156.

Figure 2:
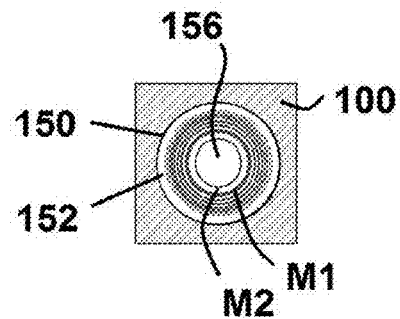
FIG. 2 shows a schematic transverse (horizontal) cross-sectional view through the device structure of FIG. 1B, through plane A-A of FIG. 1B, which shows the FZP zone structure visible as concentric circles (zones) forming a binary diffractive optics device.

For simplicity, only one cylindrical hole 156 is shown in FIG. 1B and FIG. 2. More generally, for batch-processing, the substrate comprises a wafer or disc of a suitable substrate material, for example a crystalline silicon wafer, and an array of a plurality of cylindrical holes are defined in the substrate, as illustrated schematically in FIG. 1A, and as will be described in detail in the following paragraphs. That is, the cylindrical holes are defined using a suitable anisotropic etch process, which is capable of forming holes of the required dimensions and tolerances, e.g. depth, diameter, aspect ratio, and sidewall tilt angle or slope. The sequence of layers M1 and M2 are deposited by a suitable isotropic deposition method, preferably atomic layer deposition (ALD), which is capable of providing the necessary tolerances for material characteristics, uniformity, and thicknesses of each layer of M1 and M2. Chemical Vapor Deposition may alternatively be used for some of the thicker layers. As illustrated schematically in FIGS. 1 and 2, the layer thicknesses of M1 and M2 increase towards the center of opening 156. Since the thinnest layer may be only a few nm thick, ALD is used for depositing the thinner layers with the required thickness and accuracy. ALD provides for controlled deposition of thin conformal layers, with atomically specified thicknesses, at deposition rates in the range of 10-300 nm/hr, or sub-Angstrom per ALD flushing cycle, for example. Thus layer thickness may be finely controlled by counting the flushing cycles of the ALD process or by timed depositions cycles for each layer. For faster, lower cost processing, CVD may be used for depositing the thicker inner layers.

The cylindrical holes can be produced using methods well known by those skilled in the art, e.g. by various types of reactive ion etching (RIE), ion beam etching, or metal assisted etching. The requirements for the shape and dimension of the holes, including height/depth, diameter, side wall tilt (angle) and roughness, for this diffractive optics application are well within the ranges permitted by known processes (e.g. cryo-etching by inductive-coupled plasma RIE, metal assisted etching of Si (Z. Huang, *Adv. Mater.* 2011, 23, 285-308) starting from arrays of gold disks and using a $HF-H_2O_2-DI$ water solution, or enhancements of this method using ferromagnetic layers sandwiched between noble metal bottom and top capping and a strong magnetic field (Y. Oh, Nano Lett. 2012, 12, 2045-2050) to guide the hole formation), or any other known method. These examples are listed by way of example only. Beneficially, the array of precursor forms is formed on a low cost planar substrate, such as a large diameter silicon wafer, which allows for batch-processing of arrays of a large number of diffractive optics.

Certain deep reactive ion etch (DRIE) processes, such as the standard Bosch process for forming deep, high aspect-ratio, holes in silicon, are known to form ripples or "scalloping" on the side walls of the holes. The sidewall ripples may be as large as ~100 nm. Other etching methods for forming holes of the required dimensions are known to leave surfaces with roughness in the tens of nm range. As explained above, any surface roughness, surface defects, or non-uniformities of the sidewalls of the cylindrical holes are propagated through the successive layers M1 and M2 of the FZP. The thinnest zones of the FZP may be less than 20 nm thick, and perhaps ≤5 nm thick, or ≤1 nm. Thus, in practice, it is essential to use a wall-smoothing procedure to reduce the size of the ripples or "scallops", or other surface roughness resulting from the etch process, and to smooth the sidewalls of the hole before ALD of the layer sequence of M1 and M2 forming the zones of the FZP.

The wall-smoothing method can comprise, for example, a chemical wet etch, deposition and annealing of a low temperature melting or softening material such as boron-phosphorus silicon glass (BPSG), or a polymer, deposited at a thickness comparable to, or slightly larger than, the peak-to-peak roughness of the side-walls of the initial structure. For example, for applications such as MEMs fabrication, side wall smoothing and scallops reduction via etching are described by K. Yu and A. Kumar in (US20140057446 A1), and use of annealed oxides is described by K.-Y. Weng et al. (NSTI-Nanotech 2004, www.nsti.org, ISBN 0-9728422-7-6 Vol. 1, 2004).

For fabrication of diffractive optics devices as described herein, the choice of materials for a sidewall smoothing layer has to be such that their softening or melting temperatures are higher than the ALD process temperatures for the materials described in the next section. The slope of the sidewalls of the cylindrical holes should be as close as possible to 90°, i.e. substantially vertical, but deviations of +/−1° or even higher can be acceptable. Typical values of sidewall angle are in the +/−0.5° range. The diameter of the cylindrical holes, after sidewall smoothing, should be targeted to match the diameter of the outermost zone of the FZP or diffractive optics device design targeted for fabrication. For some device structures, as discussed below with reference to alternative embodiments, a larger sidewall angle may be sought after for blazing properties of the diffractive optics, depending on their targeted application. Since the width of the outermost (thinnest) zone is typically ~20 nm or less, ideally, the smoothing layer should reduce the surface roughness of sidewalls of the hole to a required RMS surface roughness of ~10 nm and preferably 5 nm or less, typically a fraction, of the thickness of the thinnest diffractive zone, e.g. half of the thickness of the thinnest deposited layer of M1 or M2.

Once the precursor structure comprising the array of holes is formed according to the desired or targeted dimensions for the diffractive optics devices, and after providing a smoothing layer, sequential ALD depositions are carried out, starting with the thinnest zones first, comprised of material M1 and material M2. Material M1 should be a material with high absorption or high phase shifting properties at the targeted or prescribed photon or particle energy that will be focused or wave-front manipulated by the diffractive optics devices. As is well-known in X-ray physics, high absorption or high phase shifting is represented by high values of β or δ, where β and δ are the components of the complex refractive index (or complex index of refraction) expressed as $n=1-\delta-i\beta$. Suitable materials include, for example W, Ir, or Pt. Other materials are also possible, e.g. Au, or other heavy metals or their compounds, mixtures or alloys, as long as a suitable ALD process or other isotropic deposition process with stringent thickness control is available for deposition of the layers. The thickness control of the first layer/zone, or the first few layers/zones, is the critical and limiting factor for the resolution of the targeted FZP or diffractive optics device. If necessary, to reduce the process time required for the fabrication of the devices, less stringent thickness control deposition processes such as CVD or PECVD (Plasma Enhanced CVD) can be used for the subsequent, thicker, layers/zones.

To control the thickness and decide on which width for the outermost (first) layer/zone to start with, it is necessary to accurately know the diameter of the starting hole, as well as to thoroughly characterize the ALD process, especially in the less linear onset regime, to determine the thickness variance characteristic of the layer(s)/zone(s) in question. It is known that less linear growth regimes occur during the first 1-5 ALD cycles, with each ALD cycle depositing about 0.08-0.1 nm of material. Therefore, control of thicknesses in the range of 0.5-1 nm is usually possible. The method also applies to the case of sub-monolayers of materials which may become controllable and reproducible in thickness, with the progress of ALD or other high performance material deposition technology.

After the first layer of material M1 is deposited, the same ALD reactor can and should be used to deposit the first layer of material M2. The order of depositing first M1 and then M2 can optionally be reversed. M2 should be a material with transmission and phase shifting properties (i.e. complex refractive index represented by β and δ) at the target photon or particle energy greatly distinct from material M1, and with deposition properties (especially temperature) as close as possible to material M1, to minimize transition periods in switching between ALD deposition cycles. Typical materials with low absorption (β) and low δ are BN (boron nitride), carbon-based materials such as polymers, $Al_2O_3$, and others as known by those skilled in the art. Since the difference in absorption/phase shifting is important in determining the focusing properties of the FZP or diffractive optics device, pairs of M1 and M2 materials can be chosen even for lower differences in phase shifting properties, provided that the thickness of the FZP and the initial hole depth is calculated to provide sufficient absorption difference and/or a phase shift of π or sufficiently close to π, for the functionality of the diffractive optical element.

As an example of choosing the material pairs M1 and M2 for the sequential deposition, the cases of boron nitride (BN) for material M2 and W, Ir, or Pt for material M1 are described in more detail. One important detail is that all these materials have well-known ALD deposition processes, for example, as described by J. D. Ferguson et al. for BN (J. D. Ferguson et al., Thin Solid Films 413 (2002) 16-25); J. W. Elam et al. for W (J. W. Elam et al., Thin Solid Films 386 2001 41-52); T. Aaltonen et al. for Ir (T. Aaltonen et al., J. Electrochem. Soc. 2004, Vol1, 8, pp. G489-G492); and S. J. Ding et al. for Pt (S.-J. Ding et al., Nanoscale Research Lett., 2013, 8:80). Moreover, the deposition temperature ranges are overlapping, which allows choosing a common deposition temperature for M1 and M2, such that heating/cooling times in the reactor are avoided. Deposition cycles for the precursors of these materials are in the few seconds to few tens of second range, which allows for reasonably fast deposition processes. The cylindrical hole should have a height such that a straight and nearly vertical portion of height h between the top layer on the bottom of the hole should form (see FIG. 1B), where h should be such as to produce a phase difference of π between the X-rays passing through M1 and M2 at the prescribed photon or particle energy, or sufficiently close to π or as designed. The complex refractive index of X-rays can be expressed as $n=1-\beta-i\beta$, where δ and β have values in the $10^{-5}$-$10^{-10}$ range and depend on the photon energy. Optical path differences between rays passing through the high-δ value (in absolute value) materials (M1) and low δ value materials (M2) are represented by $\Delta=(1-\delta_{M1})h-(1-\delta_{M2})h=(\delta_{M2}-\delta_{M1})h$, where $\delta_{M1}$ and $\delta_{M2}$ are the values of δ for the two materials at the prescribed photon energy. For a phase difference of π, the optical path difference has to be λ/2, where λ is the wavelength of the X-rays of the prescribed photon energy. This condition is represented by Δ=λ/2, which means $(\delta_{M2}-\delta_{M1})h_\pi=\lambda/2$, where by $h_\pi$ is designated as the height of the zones giving a phase difference of π. Here from one can express the value of $h_\pi$ as $h_\pi=\lambda/2(\delta_{M2}-\delta_{M1})$.

Table 1 (FIG. 21) provides typical values of $\delta_{M1}$, $\delta_{M2}$, $h_\pi$ for photon energies of 10 keV, 30 keV, 50 keV, 100 keV and 200 keV, and the values of $h_\pi$ for the cases of pairing BN (as M2) with W, Ir or Pt (as M1). As is evident, the values of $h_\pi$ lay in the 2-40 μm range, which is readily achievable with current integrated circuit or MEMS process technology. Assuming a minimum zone width of 5 nm, which again is achievable with current ALD technology, the aspect ratios $A_{\pi\ W—BN}$, $A_{\pi\ Ir—BN}$, and $A_{\pi\ Pt—BN}$, can be calculated as presented in the last three columns of Table 1 (FIG. 21). As is evident, the values are between 400:1 and 8000:1 even for the most extreme energies shown, i.e. 200 eV which corresponds to a photon energy in the gamma-ray range. With thinner minimum ALD layers and deeper cylinders, even higher aspect ratios are possible which represent even more energetic gamma ray photons and corresponding particle energies.

The sequence of depositions of ALD layers of material M1 and M2 is repeated, with increasing deposition times for successive layers, to account for the variation in the zone widths (i.e. deposited layer thickness) with zone number. Referring back to FIGS. 1A and 1B, and FIGS. 2 to 7, FIG. 1B shows a vertical cross-section through the ALD layers of the zone plate structure deposited according to the first embodiment, and FIG. 2 shows a transverse cross-section through such a FZP structure. Since the zones in this embodiment increase in thickness, the ALD process will require greater numbers of cycles for the deposition of each material layer, and will therefore approach the linear deposition regime. Limitations on the number of M1/M2 sequences deposited can arise from limitations of the ALD equipment, such as operating costs, defect rate, schedules, et al. Zone plate structures generally function well with only a limited number of zones and it is possible to stop the sequence of ALD processes well before reaching the inner/central zone of greatest thickness and corresponding sidewall layer (zone) width (and longest deposition time). For some applications, such as for scanning X-ray microscopes, a central beam blocker is typically used to block the central part of the FZPs, therefore, rendering it unnecessary to deposit those thick inner zones.

Figure 3:
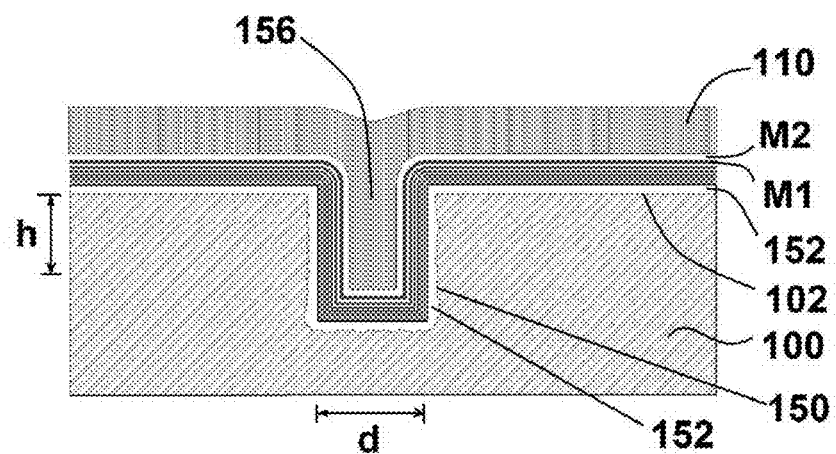
FIG. 3 shows a schematic vertical cross-sectional view through the device structure of FIG. 1B after deposition of a planarization material 110 to fill the central hole 156.

FIG. 3 shows the next step in the fabrication sequence for the FZP of the first embodiment, in which a planarization material 110 is deposited to fill the central gap or void 156, and planarize the substrate. Such planarization materials are well known in the electronics and MEMS industry, e.g. spin-on glass, polymers, flow able oxides, etc., and can be deposited by spin-on coating and thermal curing. Alternatively, filling the central gap can be done by electroplating a metal such as Au, Pt, Cu, Ni or other, preferably of high Z and atomic mass, in which case the beam blocker can be integrated directly on the zone plate structure. In that case, a plating base film will need to be deposited prior to electroplating. Optionally, a photoresist mask can be used to limit the electroplating to some targeted areas.

Figure 4:
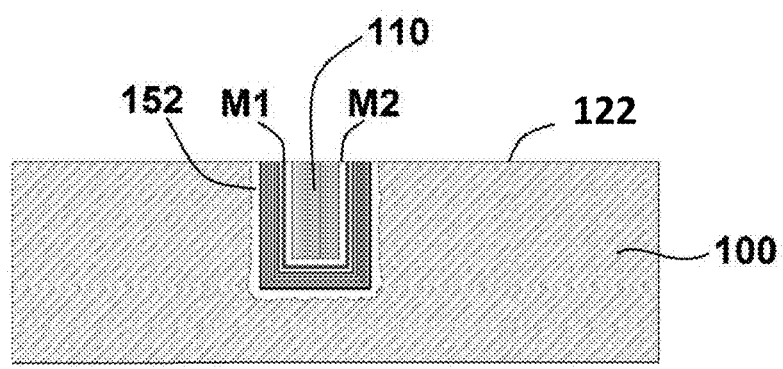
FIG. 4 shows a schematic vertical cross-sectional view through the device structure of FIG. 3, after a first planarization process comprising polishing flat the structure and stopping at the level of the surface 102 of the initial substrate material 100, or beyond it, to form a planarized top surface 122.

FIG. 4 shows the next step in the processing sequence: i.e. a first planarization by polishing the top of the substrate. Ideally, the polishing process can be conducted until the first-deposited layer of material M1, and smoothing layer 152, is exposed and polished off from the flat/horizontal top surface 102 of the substrate 100. Typically, polishing processes involved are mostly mechanical, but can have a chemical component too, i.e. one or more chemical-mechanical polishing steps, suitable for removing the materials of the planarization filler 110 and materials M1 and M2, sequentially or not. For example, a polishing process that allows a polish stop on the first substrate material is beneficial, if available. The polish stop in that case can be achieved through selective polishing properties of the slurry. Alternatively, a method that involves stopping the polish process through periodic checking or measurement of the progress of polishing through measurement of the remaining layer thickness can be used. In case the precursor diameter or sidewall slope or side wall roughness is not ideal near the top of the sidewall, e.g. near the top edge of the hole at surface 102 of the substrate 100, the polishing process can continue until that portion is polished off, i.e. removing some the original surface 102 of the substrate, to reach a flat-polished surface 122 beyond 102. For example, the first planarization polishing can be continued until reaching the top side of the precursor structure meeting designed geometrical specifications of diameter, cylindricity, side wall slope or cross-sectional shape.

FIG. 5 shows the attachment (bonding) of a carrier substrate 200 to the first substrate 100, through an intermediate layer 300. The attachment can be made through wafer bonding, such as anodic bonding, thermo-compression bonding, or adhesive bonding. An intermediate layer 300 comprising a bonding layer or adhesion layer is preferable if the bonding of the two parts by themselves is expensive or low-yielding. Typical examples of adhesion layers for anodic bonding are a sandwich of $Me/Si_3N_4/SiO_2$ layers, where Me is a metal and the insulation layer is necessary to electrically insulate the two substrates. By way of example, the metal is typically Al, Ni, W, Ti, Ti—Au, Cu, etc. and other examples of bonding metals are well known by those skilled in the art. The metal is used to spread the electric field uniformly across the metal. Uniformity in electric field is desirable to facilitate anodic bonding processes between the substrates and to avoid undesirable local electric field "hotspots" as a result of the presence of the high Z metals (e.g. W, Jr, Au, etc,) which form part of the zone plate structures. For the case of thermo-compression bonding, an alloy-forming material with the substrate (typically Si) is sought, such as Au (known to form a low-melting-temperature Au—Si eutectic). For adhesive bonding, the adhesion layer can be a polymer glue, or a combination of membrane-making materials (Si, $Si_3N_4$, $SiO_xN_y$, SiC, or other carbon-based materials) and a polymer glue as familiar to those skilled in the art of wafer bonding.

Referring to FIG. 6, after the bonding step, the material of the initial substrate 100 is thinned, e.g. polished off, until the ALD stack of layers is reached. At that point, the ALD stack of alternating high and low refractive index materials is also polished partially or totally, until a surface 132 of the central filling of planarization material 110 is exposed as a polish stop, as shown schematically in FIG. 6. Polishing continues until surface 130 is reached to provide a FZP of the required height h. The second planarization polishing can be continued until reaching a region of the precursor structure which meets the designed geometrical specifications of diameter, cylindricity, side wall slope or cross-sectional shape. The substrate 100 forms a membrane supporting the diffractive optic and the thickness of the membrane is equal to the height h of the diffractive line pattern. The height h, i.e. the distance h in the direction of propagation, can be in the range from few micrometers to hundreds of micrometers. In case the precursor diameter or slope or side wall roughness is not ideal on a portion near the bottom of the hole formed in the substrate 100, polishing can continue until that portion is polished off. This second polishing of the second (back) surface, combined with the first polishing to planarize the first (front) surface of the precursor, as described above, allows for selection of the desired or best part of the precursor height to be used for the diffractive optic element. Typically the depth of the precursor hole is deep enough so that if the precursor geometry is not ideal along its entire height, the first and second polishing steps are used to select a portion of the required height h, such as the middle portion. The second planarization polishing can be continued until reaching a region of the precursor structure which meets the designed geometrical specifications of diameter, cylindricity, side wall slope or cross section shape. For example, prior to planarization, the dimensions of the hole 156 would be first characterized by measurements and a portion of the required height h would be selected where the diameter and slope meet design requirements. That portion should then be chosen to remain after the first and second planarization processes.

After backside polishing, a window 202 is opened in the carrier substrate 200, e.g. selectively etching away part of the carrier substrate 200 to form a layer or a membrane hosting the diffractive structure, as shown schematically in FIG. 7.

For this step, coating of exposed surfaces 202 and 130 of the bonded and polished substrates with an etch-resistant film is preferred. For example, a layer of $Si_3N_4$ deposited by LPCVD or PECVD would be a suitable etch resistant film. This step would preferably be followed by opening of access to the device by front-to-back alignment contact lithography and a RIE process to etch a suitable window in the etch-resistant film (e.g. the $Si_3N_4$ layer) on the carrier substrate side, followed by anisotropic chemical etching of the substrate 200. For example, the material of choice for substrate 200 may be silicon. Alternatively, the back side etching can be performed through lithography in a thick resist layer, or lithography through a resist and RIE Bosch process-resistant hard mask, such as a Al, $SiO_2$, Ni (as non-limiting examples and where other examples of hard mask material are well known by those skilled in the art), followed by a deep dry etching process, such as the Bosch process, to reach the surface of the diffractive optics structure or, as illustrated in FIG. 7, the surface 302 of the interlayer 300 used for bonding.

Post processing, such as, CVD deposition of a protective layer (not illustrated) over exposed surfaces of the composite membrane structure can optionally be included. This protective layer can have suitable mechanical properties, such as, for mechanically strengthening the membrane or flattening out compressive stress induced buckling (stress engineering); thermal properties, such as, for dissipation of heat from the structure during its operation in the beam, which can heat and deform it; electrical properties, such as for dissipation of charges; thermo-mechanical properties, such as, for mitigation of thermal expansion properties in the composite membrane; or combinations thereof. The nature of the protective layer film and the deposition process (e.g. by CVD) should to be chosen to be compatible with the materials present in the structure before coating to achieve the desired mechanical, thermal, electrical, properties. Such a layer can also have the form of an engineered layer or multiple layers to host integrated functionalities such as passive or active components for beam monitoring, such as flux monitoring, alignment, temperature or safety switch off, or to host conductive leads to contact circuit devices integrated in the substrate or carrier, for these functionalities.

Post processing may also comprise reshaping or trimming individual diffractive optics elements. For example, it may be required to shape the precursor and ALD layers by removing end-rounded ALD layers on elongated ridges, or for precursor forms with angled sidewalls, reshaping edges of the ALD layers. Optionally, additional processes, such as ion implantation for stress and buckling compensation, or selective etching of the remaining material of the initial substrate 100, or of the bonding layer 300, or of any of the materials M1 and M2 of the optical diffractive structure to fine-tune or enhance its optical performance can be performed. For example, removal of the bonding layer may be desirable to achieve a desired property in the final diffractive optics device. Post processing can be performed for enhancing the device functionality by the integration with other devices, for example, building a beam blocker on top of a FZP as used for scanning X-ray microscopy purposes or integrating a FZP on a micro-electro-mechanical system (MEMS) device, for alignment or fine positioning manipulation within larger devices or systems. Such functionalities can be integrated along with other functionalities already mentioned, with part of their circuitry present in the substrate 100 or carrier 200.

The device structure of the first embodiment described above benefits from the fact that the narrower layers/zones are deposited at the beginning of the process in near proximity to the outer edge of the hole and these layers/zones accumulate less radius error through depositional or other errors in thickness of each of the successive layers. However, there can be a disadvantage that the magnitude of the roughness of the initial hole walls is similar to the thickness of the first layer/zone width, which may be e.g. ~5 nm to ~20 nm, or even larger. Accordingly, as described above, beneficially, a sidewall smoothing layer is provided before deposition of the sequence of layers of M1 and M2 which form the diffractive optic.

In a variant of this embodiment, to smooth the side walls, the deposition can start with a thick ALD layer (any of M1 or M2, or even a different ALD layer Mx), which can be annealed to a flowing or roughness smoothing point, to reduce the initial wall roughness and thereby reduce the effect of the wall roughness or non-uniformity on the first layer/zone. Alternatively, a smoothing layer comprising BPSG or a polymer layer can be provided, as described above.

The order of deposition of layers M1 and M2 may be reversed. That is, the use of material M1 (high absorption or refractive index) for the first deposited zone is not mandatory. The deposition can start with material M2 (low absorption or refractive index), since the principle of Babinet (e.g. see M. Born and E, Wolf, Principles of Optics, Sixth edition, Cambridge University Press, 1998, p. 381) assures that the diffraction properties of the resulting structure with reversed M1-M2 order will be the same as for a device deposited with the non-reversed M1-M2 order, i.e. starting with M1, then M2.

The choice of zone widths, translated into the values of the deposited layers thickness in the sequence of depositions has to reflect the targeted functionality of the device. The following example illustrates the focusing of X-rays using FZPs using the inventive method. Let's assume that after the fabrication of the cylindrical hole 150 in substrate 100 (i.e. the dimensions of the hole after all smoothing procedures have been applied) the radius of that hole is $r_c$, and that the targeted FFP should have a focusing distance f at a prescribed X-ray wavelength of $\lambda$. For a FZP to function effectively, the basic relationship $$r_n = \sqrt{n\lambda f + \frac{n^2\lambda^2}{4}} \approx \sqrt{n\lambda f} \quad (1)$$

has to be fulfilled, where n is the order of the Fresnel zone, counted from the center of the FZP to the outermost (thinnest) zone. Therefore, an order for the outermost zone, $n_c$, can be established as $$n_c \approx \left[\frac{r_c^2}{\lambda f}\right], \quad (2)$$

where the brackets represent the rounding towards an integer value of the contained argument.

The thickness of the first deposited layer should be $t_1$ $$t_1 \approx r_c - r_{n_c-1} = r_c - \sqrt{\left(\left[\frac{r_c^2}{\lambda f}\right] - 1\right)\lambda f} \quad (3)$$

while the successive layer thicknesses should be $$t_2 \approx r_{n_c-1} - r_{n_c-2} = \sqrt{\left(\left[\frac{r_c^2}{\lambda f}\right] - 1\right)\lambda f} - \sqrt{\left(\left[\frac{r_c^2}{\lambda f}\right] - 2\right)\lambda f} \quad (4)$$

$$\cdots$$

$$t_k \approx r_{n_c-k+1} - r_{n_c-2} = \sqrt{\left(\left[\frac{r_c^2}{\lambda f}\right] - k + 1\right)\lambda f} - \sqrt{\left(\left[\frac{r_c^2}{\lambda f}\right] - k\right)\lambda f} \quad (5)$$

eventually reaching $k=n_c$ if a central zone (n=0) is targeted. However, zone depositions can be stopped at an earlier, convenient time or value of k, since thick layers require longer (i.e, more costly) deposition times. It should be noted that in using this strategy, the first deposited layer of thickness $t_1$ covers more than a Fresnel zone, but this is required since a thickness lower than the minimum thickness that can be deposited is not (by definition) possible. The minimum zone thickness is supposed to be the next one (in the order of deposition, i.e. k=2).

Alternatively, if the diffractive device is not a FZP, or is a FZP of a special configuration, the deposited material thicknesses are not required to follow relation (1). The deposited material thicknesses would be defined by the appropriate zone width specifications of the diffractive device that is being targeted, i.e. to form a specific diffractive line pattern. By way of example only, other diffractive devices may comprise devices with equal thickness zones (equivalent to axicons), FZPs with missing zones (known as fractal zone plates), FZPs with composite design and others, as well-known to those skilled in the art.

Figure 8A:
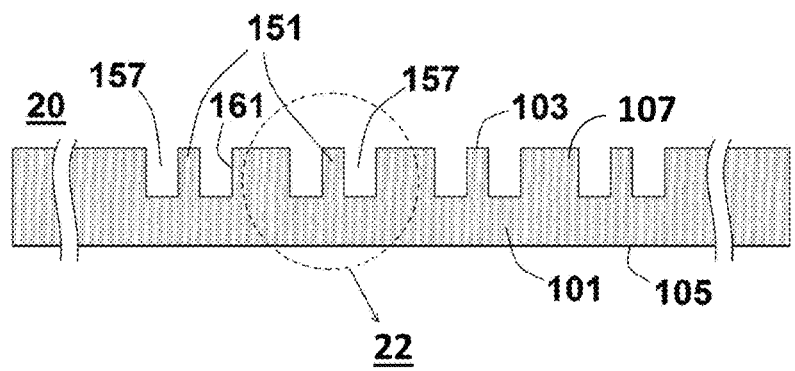
FIG. 8A shows a schematic vertical cross-sectional view through part of a device structure of a second embodiment, wherein the precursor structure comprises an array of cylindrical columns 151 within cylindrical holes 161, etched in a substrate 101.
Figure 8B:
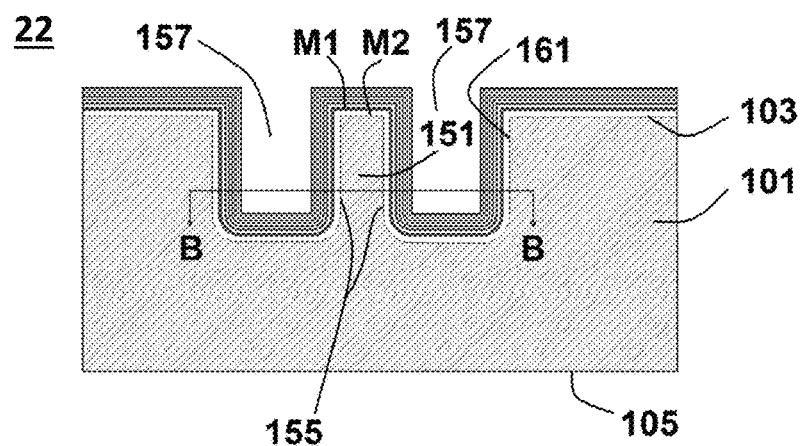
FIG. 8B shows an enlarged view of part of FIG. 8A after sequential deposition of alternating material layers M1 and M2 of an FZP of the second embodiment.
Figure 9:
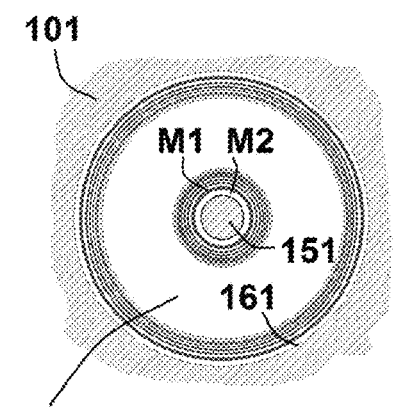
FIG. 9 shows a schematic transverse (horizontal) cross-sectional view through plane B-B of the device structure of FIG. 8B to show the FZP zone structure, visible as concentric circles (zones) forming a binary diffractive optics device around the central column 151.

A fabrication sequence for a device structure comprising a diffractive optic in the form of a FZP according to a second embodiment is illustrated schematically in FIGS. 8A and 8B, and Figs. 9 to 14. For this embodiment, the precursor structure 20 comprises a substrate having a planar front surface 103 and a back surface 105. An array of cylindrical columns is defined in the front surface, as shown in FIG. 8A, each column being concentrically formed within a cylindrical hole 157. FIG. 8B shows an enlarged view of one of the forms comprising one cylindrical column 151 within a cylindrical hole 157. The processing sequence for deposition of layers M1 and M2 of the device structure of second embodiment follows a similar sequence of steps as that of the first embodiment, except that the column 151 forms the core of the diffractive optic, and therefore, the ALD deposition of the sequence of layers/zones starts with the thickest layer/zone and ends with the thinnest layer/zone in the stack, as shown schematically in the vertical cross-sectional view in FIG. 8B, and in the transverse cross-sectional view shown in FIG. 9, which is taken through plane B-B of FIG. 8B, which shows schematically the diffractive line pattern formed by a sequence of m layer stacks (M2, M1)$_1$, (M2, M1)$_2$ ... (M2, M1)$_m$ wherein (M2, M1)$_m$, is the thinnest pair of layers/pair of zones. The thickest layer/zone is not necessarily zone 2 (counting the central cylindrical column 151 as the central zone 1 for the FZP/diffractive optics device), but can be any zone of higher number n, provided that the sequence of alternating M1/M2 layers (or M2/M1 layers as illustrated) matches the structure of a FZP starting with the zone number n and zone widths decrease from there proportional to 1/sqrt(n+k), where k is the zone number for the order of deposition.

The precursor structure for the FZP in this embodiment is formed by patterning and etching the front surface 103 of the substrate using a suitable anisotropic etch process, which is capable of producing columns of the required dimensions, aspect ratio, sidewall tilt (angle) and surface roughness. A smoothing process or a smoothing layer (not illustrated in FIGS. 8A and 8B) is provided to reduce surface roughness of the sidewalls of the columns, as described for the device structure of the first embodiment. Note that the high aspect ratio columns 151 are formed within a relatively wide cylindrical hole 157. Thus, this structure places less restrictions of the etch process, i.e. the hole or opening surrounding the column has a lower aspect ratio. The surrounding hole also facilitates measurements for characterization of the dimensions and other parameters of the columns. Also the region 107 of the substrate around each hole 157 provides a reinforcing region during subsequent processing.

Subsequent processing steps, shown schematically in FIGS. 10 to 14, are similar to those described for the method of the first embodiment, except as noted above, since each column forms a core of the diffractive optic, the thickest layer of the M1/M2 layer stack is deposited first, and the thinnest layer is deposited last.

Figure 10:
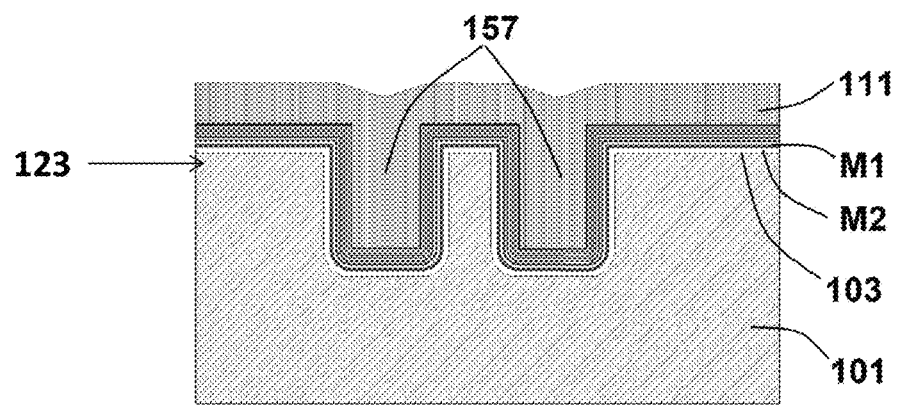
FIG. 10 shows a schematic vertical cross-sectional view through the device structure of FIG. 8B after depositing a planarization material 111 onto the ALD-deposited central column and filling the adjacent gap 157 surrounding the column.
Figure 11:
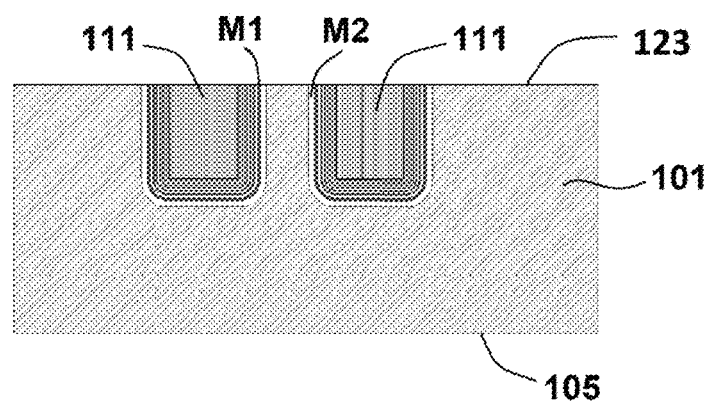
FIG. 11 shows a schematic vertical cross-sectional view through a device structure of FIG. 10, after polishing flat the structure and stopping at the level of the surface of the initial substrate material 101, or beyond it, to form a flat surface 123.
Figure 12:
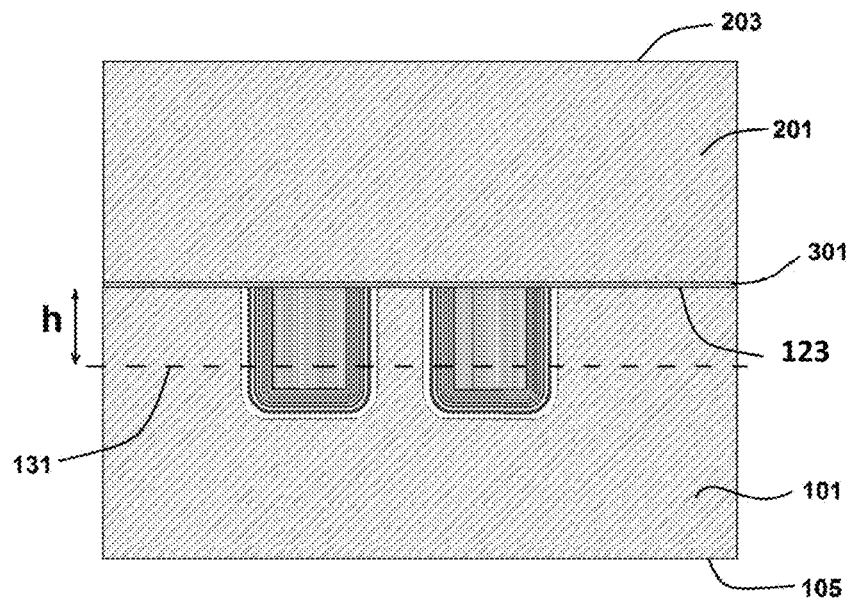
FIG. 12 shows a schematic vertical cross-sectional view through the device structure of FIG. 11, after bonding a carrier substrate 201 to the initial substrate, using a bonding layer 301.
Figure 13:
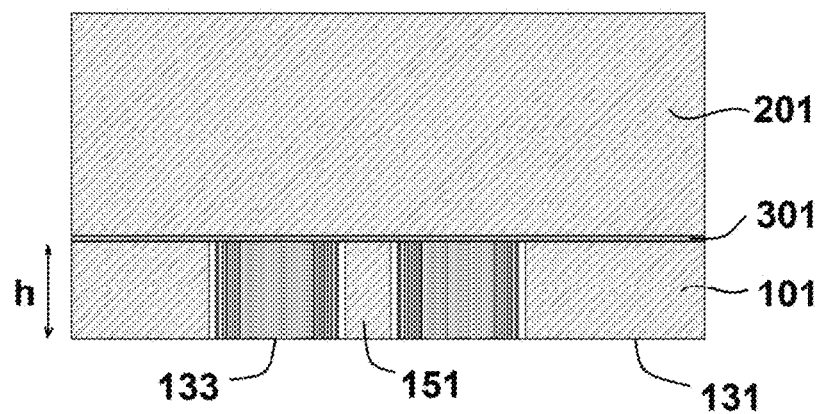
FIG. 13 shows a schematic vertical cross-sectional view through the device structure of FIG. 12, after polishing off part of the first substrate 101, with a polish stop at the level of the last-deposited ALD layer (inclusive) or beyond it, to form a flat surface 131.
Figure 14:
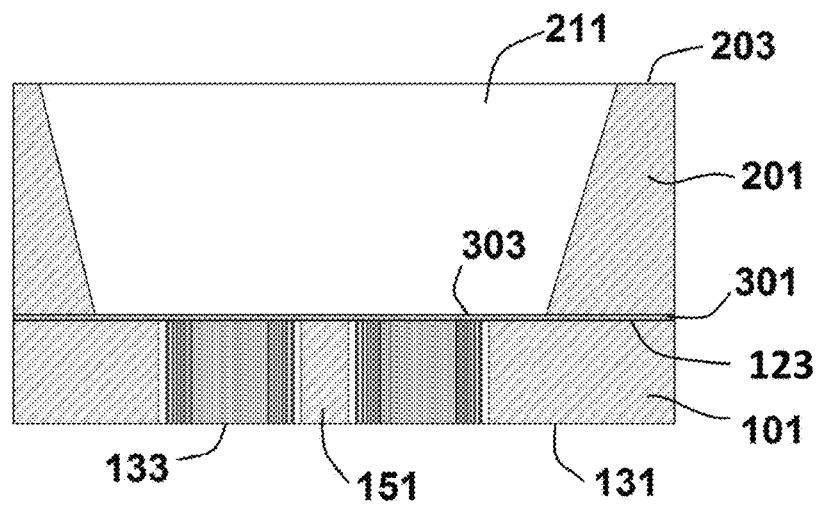
FIG. 14 shows a schematic vertical cross-sectional view through the device structure of FIG. 13, after opening a window 211 from the back side in the material of the carrier substrate 201, with an etch stop at the surface 303 of the bonding layer 301, to form a membrane-based diffractive optical device.
Figure 15:
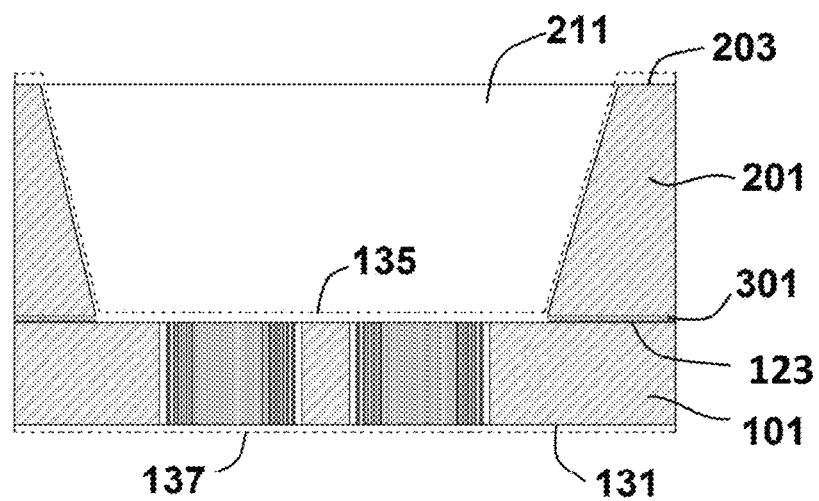
FIG. 15 shows a schematic vertical cross-sectional view through the device structure of FIG. 15, and further comprising optional layers 135 and 137.

As illustrated in FIG. 10, after deposition of the M1/M2 layer stack on each column, a planarizing layer 111 is deposited over the wafer, to fill any gaps or voids left in the surrounding hole around the column and M1/M2 layer stack, followed by planarization by polishing, e.g. one or more chemical mechanical polishing steps, as illustrated schematically in FIG. 11, to expose top surface 103, or polish beyond it, to reach a surface 123, where the precursor geometry fits the shape specifications. A carrier wafer 201 is then bonded to surface 123 with an intermediate layer 301, as illustrated in FIG. 12. Then, the underlying substrate is removed leaving a planarized surface 131 as illustrated in FIG. 13. A window 211 is then opened from the surface 203 of the carrier substrate 201 to expose the surface 303 of the intermediate layer 301, as shown schematically in FIG. 14, leaving the diffractive optic supported in the surrounding substrate 100 on intermediate layer 301. As mentioned with respect to the first embodiment, this process for opening a window typically uses a lithographic process to form a hard mask, followed by a selective chemical or reactive ion etching of the carrier substrate material. Other windows etching methods in the carrier substrate can also be used, such as laser drilling or machining, mechanical machining, ion beam etching, focused ion beam etching, chemical assisted laser etching, reactive ion beam etching (RIBE), chemical assisted ion beam etching (CAIBE), or combinations thereof. In the case that the first substrate is robust enough to support the second planarization and later, handling the optical devices, the carrier substrate can be removed in its totality.

The formation of the initial structure comprising a cylindrical column within a cylindrical opening having the required dimensions, side wall smoothing considerations, the post-processing, additional processing and starting material order considerations for the device structure and method of the first embodiment also apply to those of second embodiment. Since fabrication of the device structure of the second embodiment starts with deposition of a thicker zone and ALD is known to smoothen the roughness while deposition proceeds, this sequence of deposition will help to smooth the subsequent depositional surfaces as later thinner layers/zones, or even the outermost, thinnest layer/zone, are deposited. However, the error accumulation from the initial depositions to the later depositions does tend to produce more significant thickness errors in the subsequent thinner layers/zones. Accordingly, fabrication of FZP on columns can benefit from providing an initial smoothing layer on each column, to reduce surface roughness (e.g. to provide an RMS surface roughness of half the thickness of the thinnest layer of the diffractive line pattern), prior to deposition of the M1/M2 layer sequence.

A device structure of a third embodiment comprises a diffractive optic for higher order than binary diffraction. It is known that binary diffraction optics provide only a first order approximation towards a more complex, continuously-varying phase or absorption objects, such as typically embodied by kinoforms. A closer-to-continuum variation of optical path and phase differences in diffractive optics can be realized by providing a structure comprising a plurality of three or more materials in successive layers, M1, M2, ... MN, rather than two materials M1 and M2, as described with reference to the device structures of the first and second embodiments which are based on a binary optics approach.

Figure 16:
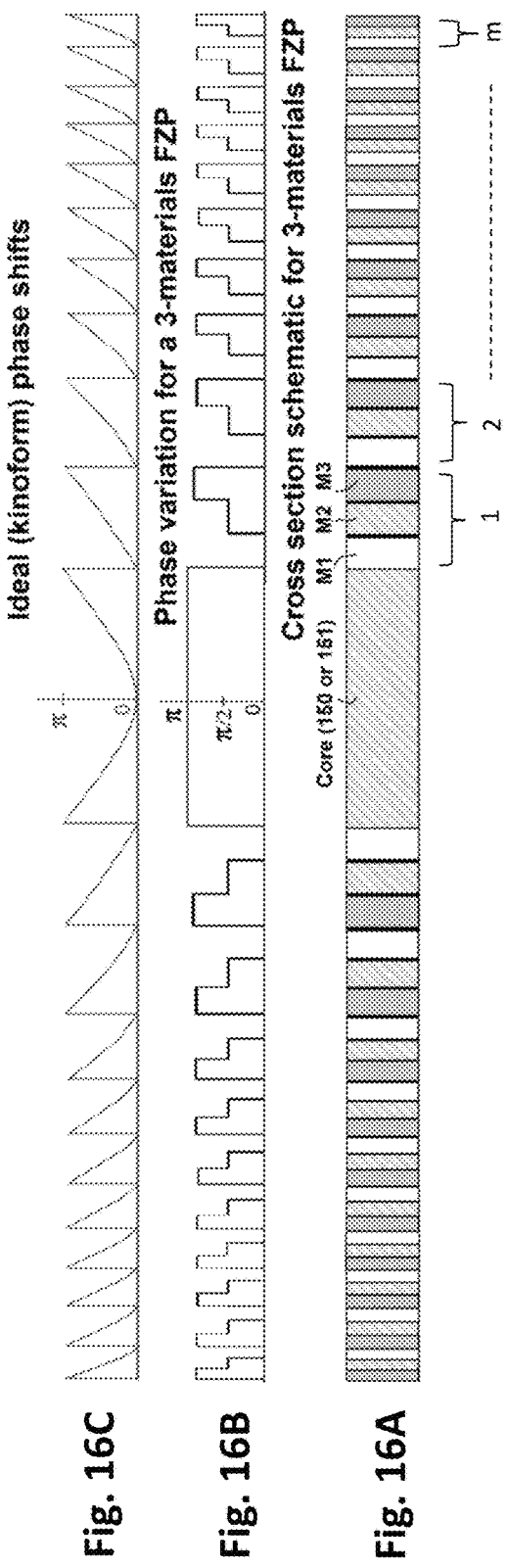
FIG. 16A shows a schematic cross-sectional view of an three-phase diffractive optics device of a third embodiment, comprising a FZP for hard X-rays, using a three layer stack of materials M1, M2, and M3.
FIG. 16B shows a resulting 3-step phase shifts approximation of an ideal continuous-varying phase shift in a kinoform, as shown in FIG. 16C.

For the particular case of FZPs for X-rays, using a plurality of layer stacks of three or more layers of materials, the e.g. material types of layers M1, M2, M3, or a plurality of layers M1 to MN, their thicknesses are calculated to match their absorption and phase shifting properties with the corresponding sub-zone widths and thicknesses. ALD is ideal for realizing such gradual phase transitions, using 3 or more ALD layers, if the multiple layers are compatible in terms of processing. The latter mainly involves the ALD processes being conducted at the same temperature and with non-mutual-reacting chemistries. While in diffraction optics with only two materials the order of materials M1 and M2 in the sequence is not important, in devices with 3 or higher number of materials, the order Ml, M2 and M3 is important. For the case of FZPs for focusing as illustrated in FIG. 16A, the order of M1, M2, and M3 should be such that $\delta_1 < \delta_2 < \delta_3$. FIG. 16A shows a schematic cross-sectional view of a three-phase diffractive optics device of another embodiment, comprising a FZP for hard X-rays, using a three layer stack of materials M1, M2, and M3. As illustrated in FIG. 16A, for deposition around a column that forms the central core 150 or 151 of the diffractive optic, for three -layer stacks (M1, M2, M3), for $\delta_1 < \delta_2 < \delta_3$, the sequence of deposition of layers for each diffractive line/zone is in the order (M1, M2, M3)$_1$, (M1, M2, M3)$_2$ ... (M1, M2, M3)$_m$, FIG. 16B shows a resulting 3-step phase shifts approximation of the ideal-continuous—varying phase shift in a kinoform as shown in FIG. 16C.

An example of a three material system to achieve such a variation of $\delta$, i.e. wherein $\delta_1 < \delta_2 < \delta_3$ is M1=BN (boron nitride), M2=$Al_2O_3$ (aluminum oxide), M3=W (tungsten). The extension towards a larger number of materials and sub-zones is evident.

Figure 17:
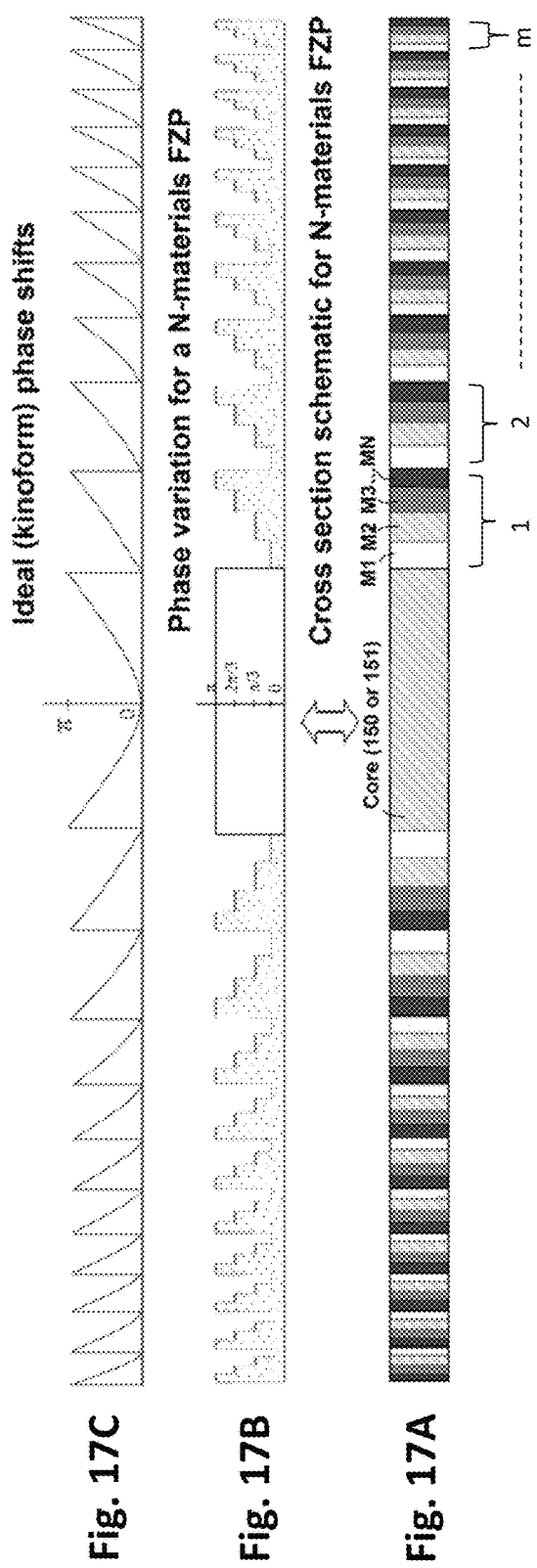
FIG. 17A shows a schematic cross-sectional view of a multiple-phase diffractive optics device of a fourth embodiment, comprising a FZP for hard X-rays, using multiple layers (N) stacks of materials M1, M2, . . . MN.
FIG. 17B illustrates the resulting N-steps phase shift approximation of an ideal continuous-varying phase shift in a kinoform, as shown in FIG. 17C.

FIGS. 17A, 17B and 17C illustrates a device structure of yet another embodiment, with extension towards multiple materials M1, M2, M3, ..., MN, for example, a FZP for hard X-rays, for which the relation $\delta_1 < \delta_2 < \delta_3 < ... < \delta_N$ has to be fulfilled. As illustrated in FIG. 17A, for deposition around a column that forms the central core 150 or 151 of the diffractive optic, in which each N-layer stack comprises (M1, M2, M3, ... MN), for $\delta_1 < \delta_2 < \delta_3 < ... < \delta_N$, the sequence of deposition of layers for each diffractive line/zone is in the order (M1, M2, M3, . . . MN)$_i$ (M1, M2, M3, . . . MN)$_2$. . . . (M1, M2, M3, . . . MN)$_m$.

Thus, FIG. 17A shows a schematic cross-sectional view of a multiple-phase diffractive optics device of a fourth embodiment, comprising a FZP for hard X-rays, using multiple layers (N) stacks of materials M1, M2, . . . MN. FIG. 16B illustrates the resulting N-steps phase shift approximation corresponding to an ideal continuous-varying phase shift in a kinoform as shown in FIG. 16C. Thus, it will be appreciated that the method can be readily generalized for multilayer stacks of ALD films, M1, M2, . . . MN, to approach a smooth variation of absorbance of phase shifting across Fresnel zones, for an increase in efficiency and elimination of unwanted focusing/diffraction orders.

In the device structures of the embodiments described in detail above, the diffractive optics comprise diffractive line patterns in the form of concentric circular zones, formed within a cylindrical hole or around a cylindrical column or post. By providing a precursor structure or form comprising a planar substrate in which is defined an array of cylindrical holes, or an array of cylindrical columns, batch-processing, using processes adapted from microelectronics and MEMs fabrication, allows for a large number of high aspect ratio diffractive optics, such as Fresnel Zone Plates, to be fabricated on a single wafer.

Other precursor structures, i.e. different geometric forms, such as an array of linear trenches may alternatively be provided to fabricate diffractive optics of other forms.

For example, in a method of fabrication of a devices structure of a yet another embodiment, comprising a linear (one-dimensional) diffractive optic, the process starts by forming a precursor structure comprising an array of linear trenches etched into the initial planar substrate, followed by successive ALD depositions of pairs of layers M1 and M2, or sequences of layers M1, M2 . . . MN, to form device structures comprising diffraction gratings, coded linear apertures or linear focusing devices such as multilayer Laue lenses (MLLs). Thus, these devices can also be formed by batch-processing at wafer level using methods as disclosed herein.

Figure 18:
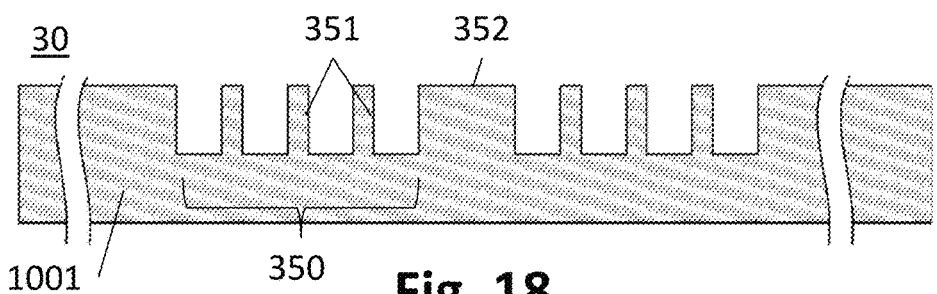
FIG. 18 shows part of a device structure according to an embodiment comprising a planar substrate wherein the precursor form comprises an array of a plurality of recesses, such as cylindrical holes, wherein a group of a plurality of columns is defined within each hole in the top surface of a planar substrate.
Figure 19:
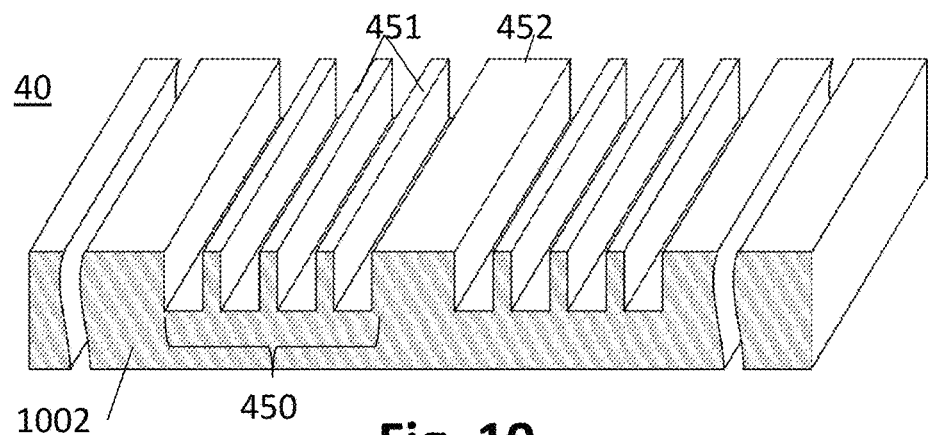
FIG. 19 shows part of a device structure according to an embodiment comprising a planar substrate wherein the precursor form comprises an array of linear, rectangular, ridges defined within trenches.
Figure 20:
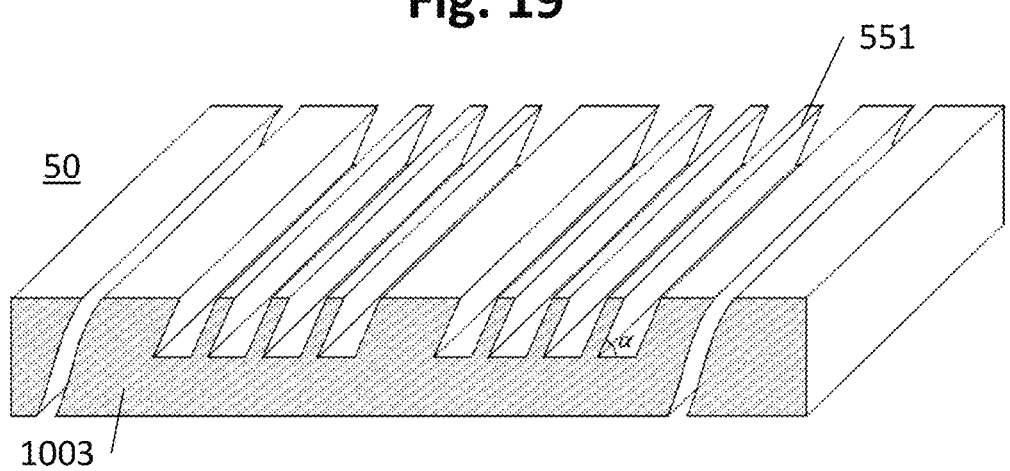
FIG. 20 shows part of a device structure according to an embodiment comprising a planar substrate wherein the precursor form comprises an array of linear, trapezoidal shaped, ridges within trenches, having a sidewall angle $\alpha$ relative to the wafer plane.

By way of example, FIGS. 18 to 20 show some device structures according to alternative embodiments formed from precursor structures of different geometries.

A precursor form 30 for an FZP of another embodiment comprises a substrate wafer 1001 having an array of a plurality of holes 350, with a plurality of columns 351 defined in each hole 350, with an intermediate island 352 of the substrate between each hole 350 as illustrated in the schematic cross-sectional view in FIG. 18.

For example, for a two dimensional diffractive optic, if the precursor form 30 comprises an array of cylindrical columns 351 of the appropriate dimensions for forming FZP similar to those of the second embodiment, the columns in holes are structured for forming arrays of zone plates with at least a minimum distance between them. That is, while the precursor form illustrated in FIG. 8A has one cylindrical column in each cylindrical hole, the precursor form as illustrated in FIG. 18, for forming a two dimensional diffractive optic, comprises a group of a plurality of cylindrical columns 351 formed within each cylindrical hole 350, with islands 352 of the substrate surrounding each hole. The larger islands 352 or reinforcing regions of the substrate around groups of columns provide a more robust substrate structure during fabrication, and e.g. to provide areas of the planar substrate surface that act as a polish stop layer for the chemical-mechanical polishing steps.

For forming one dimensional diffractive optics, a precursor form 40 of another embodiment is illustrated in the view shown in FIG. 19. The cross-sectional form is similar to that shown in FIG. 18, but the precursor form 40 etched in the substrate wafer 1002 has a linear structure, wherein the holes comprise linear trenches 450, of rectangular cross-section, and a group of a plurality of the columns 451, in the form linear ridges of rectangular cross-section, are formed in each trench 450, to form a linear array. The larger islands 452 or regions of the substrate around groups of columns provide a more robust substrate structure during fabrication, and e.g. to provide areas of the planar substrate surface that act as a polish stop layer for the chemical-mechanical polishing steps Alternatively, columns of various forms can be arranged to form a square, hexagonal (honeycomb) or any other type of array.

As an example, this way, arrays of FZPs can be fabricated, for instance, useful for X-ray lithography purposes. For example, structures have been described for UV lithography, e.g. H. Smith (H. I. Smith, J. Vac. Sci. Technol. B 14(6), November/December 1996, pp. 4318-4332) or patent WO 2004010228 A2 (R. Menon et. al., 2004, "Maskless lithography using an array of diffractive focusing elements"). The process disclosed herein to form arrays of FZPs extends the spectral domain of the technology towards higher photon energy or particle beams.

FIG. 20 shows a device structure comprising a diffractive optic of yet another embodiment, comprising a substrate 1003 wherein a precursor form 50 comprises a plurality of columns or ridges 551 with slanted walls within a surrounding trench. That is the sidewalls of the columns or ridges extend at an angle α relative to the wafer plane (i.e. the plane of the surface of the substrate), so that the ridges have a cross-section of trapezoidal shape. For example, this form of structure can be used to form a diffractive optic which diffracts an X-ray beam out of the wafer plane, in a specified direction. Depositing sequential ALD layers M1, M2, or M1-M2- . . . MN onto the slanted walls would result in tilted gratings, suited for introducing X-rays into the plane of the substrate, useful for 2D optics in waveguides. In that case, after planarization, some trimming or reshaping of the structures may be required. For example, etching off part of the structures e.g. by combinations of lithographic and reactive ion etching or ion beam etching means, or focused ion beam, can be used to remove in-plane areas of sequential ALD-coated precursors, to allow the un-hindered in-plane propagation of the beam.

Fabrication of devices structures of exemplary embodiments have been described in detail herein, by way of example only. In these examples, fabrication by batch-processing provides an array of a plurality of similar diffractive optics on each wafer. In further alternative embodiments, it will be appreciated that, for example, a plurality of diffractive optics of different forms or geometries may be fabricated on the same wafer. For example, it is also possible to produce linear devices on the same wafer as devices with circular or other symmetry. Or alternatively, in a wafer batch, some wafers may define an array diffractive optics of a first structure and other wafers define arrays of diffractive optics of other structures. Where optics of different structures are to be combined on a single wafer, the rule of combining different diffractive optical elements on a same wafer or batch of wafers is that the structures must share the same sequence of layers M1, M2, or layers M1, M2, . . . MN, i.e. including the same materials and thicknesses, to allow simultaneous processing by ALD. For example, precursor forms with columns and holes cannot be combined on one substrate, since the thinnest layer is deposited first for holes and the thickest layer is deposited first for columns.

In the structures of some of the embodiments described above, the holes and columns are preferably cylindrical, i.e. with substantial vertical sidewalls, or with a small sidewall tilt angle. In other alternative embodiments, the shape of the holes or the shape of the columns may be varied.

For example, a certain tilt angle or other structuring of the side walls of structures used to deposit the sequential ALD layers is possible, allowable, and potentially advantageous to the functioning of the diffractive optical devices so fabricated, as long as the slant angle and other geometrical parameters of the resultant device are well controlled. For example, a tilt angle or slope of the sidewalls of holes for the device structure of the first embodiment, as well as a tilt of the sidewalls of the columns for the device structure of second embodiment, could lead to an enhancement of the focusing efficiency in a certain focus spot corresponding to a focus order towards which the tilted zone is pointing/blazing. Variations of the tilt angle close to this blazing direction can provide "guidance" of the hard X-rays or particle beams by channeling them in those directions, as long as the reflections on the adjacent zone walls are close to the total reflection condition. Recently, an analogous effect of guiding of X-rays through curved (similar to tilted) micro-channels was proven (T. Salditt, et al., Phys. Rev. Lett. 115, (2015), 203902), implying that such blazing through tilted zones is possible. This might alleviate the strict requirement for the fabrication of right angles and no wavinesss for the sidewall of the central column or hole, leading towards a more technologically-achievable result for current generations of patterning processes.

INDUSTRIAL APPLICABILITY

In summary, a batch manufacturing process is disclosed for fabrication of diffractive optics, and in particular super-high aspect ratio diffractive optics suitable for high energy X-rays or gamma rays or particle beams.

It will be appreciated there is overlap in energies of high photon energy X-rays and low photon energy gamma rays. The methods disclosed herein may be applied for diffractive optics, such as zone plates, for X-rays having energies in the range from 5 keV to several hundred keV, and for gamma rays which extend to higher energies, e.g. 400 keV or more.

For example, zone plates having an aspect ratio greater than 100:1, would provide some focusing effect of X-rays at ~8 keV, but would be far from ideal. An aspect ratio upwards of 250:1 would typically be required for efficient focusing of x-rays of 8 keV, e.g. for X-ray microscopy. As illustrated by the examples in Table 1 (FIG. 21), for focusing or reshaping wavefronts of photons or particle beams having higher energies, significantly higher aspect ratios, e.g. ~1000:1 or ~10,000:1 may be required.

The method adapts a sequence of standard wafer processing techniques, which are known from the micro-electronics or MEMS industry, to allows batch/parallel processing of several to hundreds or thousands of devices and allows for a variety of optics design configurations to be processed simultaneously on the same wafer or on multiple wafers in a wafer lot.

This approach offers a number of potential advantages over known processes, for example:
  The substrate/wafer may be a low cost substrate such as a single crystal silicon wafer, which allows for large wafer scale processing on e.g. 4 inch, 8 inch or larger diameter wafers.
  An array of starting structures such as cylindrical columns or holes, or columns or holes of other shapes, as suited for the respective diffractive optic design, can be formed with high precision using standard processing techniques, such as, lithography followed by reactive ion etching, or metal assisted chemical etching, or focused ion beam machining.
  A subsequent side wall smoothing process is provided to provide the structures with the required dimensions and tolerances and having a surface roughness smaller than a fraction of the thinnest diffractive zone.
  For deposition of a sequence of layers for binary or higher order diffractive optic, an isotropic deposition process, for example ALD, optionally combined with CVD for thicker layers, provides for a time-controlled deposition on the starting structures (precursor forms) of the sequence of alternating layers of M1, M2, . . . MN with controlled thicknesses.
  The materials of each layer, their absorption and refractive index characteristics, and the thicknesses of each layer are selected according to the targeted design requirements, i.e. for electromagnetic radiation or particle beams of a predetermined energy, such as, X-rays or gamma rays, or particle beams of similar energies.

In subsequent processing, instead of conventional slicing, unwanted parts of the layers of ALD and CVD deposited materials and the substrate are removed by one or more planarization processes, such as mechanical polishing or chemical mechanical polishing, to leave planarized front and back surfaces.

For example, the top polished substrate surface can be attached or bonded to a carrier wafer for removal of the underlying substrate, e.g. by thinning and polishing off the initial substrate/wafer to the point at which the ALD-coated columns or holes structure is reached and the ALD material is totally or in part polished off from back surface.

The carrier substrate wafer can then be patterned as required, e.g. to open windows, using a process such as reactive ion etching or chemical etching, and form membranes on which the diffractive optics are supported or hosted.

Optionally, post-processing may include, for example, reinforcing the device with additional layers deposited by CVD methods for support or mechanical purposes (e.g. flattening of the membranes), etching away the initial substrate/wafer material or part or the entirety of one or several of the ALD-deposited layers, ion implantation for mechanical purposes, or enhancing the device functionality by the integration with another device or devices, for example, building a beam blocker on top of a FZP as used for scanning X-ray microscopy purposes or integrating a FZP on a micro-electro-mechanical system (MEMS) device, for fine positioning manipulation, or, for formation of in-wafer-plane optics (i.e. with beams propagating parallel to the substrate surface, rather than transverse to the surface).

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A method of fabrication, by batch-processing, of a plurality of device structures each comprising a high aspect-ratio diffractive optic having a specified diffractive line pattern for photons or particle beams of a prescribed wavelength or energy, comprising:
   providing a first substrate having a planar front surface and back surface;
   performing an anisotropic etch process comprising patterning of the front surface of the substrate and removal of material of the substrate to define a precursor structure comprising an array of a plurality of precursor forms comprising one of:
   a) mesas having sidewalls of predetermined vertical and lateral dimensions and sidewall angle;
   b) mesas within holes or trenches, the mesas having sidewalls of predetermined vertical and lateral dimensions and sidewall angle; and
   c) a combination thereof;
   smoothing sidewalls of the mesas to a predetermined sidewall surface roughness;
   depositing thereon a sequence of layers defining the specified diffractive line pattern comprising a plurality of m layer stacks, each layer stack comprising at least a pair of layers comprising a layer of a first material (M1) and a layer of a second material (M2), said layer stacks being deposited by an isotropic deposition process providing conformal layers of controlled layer thicknesses on sidewalls of each mesa in sequence $(M1, M2)_1, (M1, M2)_2 \ldots (M1, M2)_m$,
   each of said first and second materials having a different selected complex refractive index at the prescribed wavelength or energy,
   wherein each mesa forms a core of one of the diffractive optics and said step of depositing comprises controlling the layer thickness of each pair of layers (M1, M2) of the sequence $(M1, M2)_1, (M1, M2)_2 \ldots (M1, M2)_m$ to define diffractive lines of the specified diffractive line pattern around each mesa;
   after forming the sequence of layers, providing a planarization layer thereon filling remaining surface voids;
   performing a first planarization to remove parts of the planarization layer and the sequence of layers and exposing a planarized front-side surface comprising a first surface of each mesa, of the diffractive lines around each mesa and surrounding parts of the planarization layer and the first substrate;
   attaching a carrier substrate to the planarized front-side surface;
   performing a second planarization to thin the backside of first substrate and remove part of the first substrate and the sequence of layers to provide a planarized back-side surface exposing a second surface each mesa, of the diffractive lines around each mesa and first substrate; and
   removing at least part of the carrier substrate to expose the first surface of the diffractive lines defining the specified diffractive line pattern around each mesa, thereby producing an array of a plurality of diffractive optics supported by remaining parts of the first substrate and the carrier substrate;
   wherein, for photons or particles of the prescribed wavelength or energy, an axial height h between the first surface and second surface of each of the diffractive lines of each diffractive optic, in a propagation direction, provides at least one of:
   a required absorption difference between adjacent diffractive lines,
   a phase shift difference of $\pi$ between adjacent diffractive lines, and
   a phase shift difference of a designed fraction of $\pi$ between adjacent diffractive lines;
   and wherein the aspect ratio of the axial height h and the layer thickness of a thinnest layer of the sequence of layers of the diffractive line pattern is greater than 10:1.

2. The method of claim 1, wherein smoothing sidewalls of the mesas to a predetermined sidewall surface roughness comprises, prior to depositing the sequence of layers of M1 and M2, providing a sidewall smoothing layer, the sidewall smoothing layer having an RMS surface roughness no greater than a fraction of the thickness of a thinnest layer of the ordered sequence of layers of M1 and M2 of the diffractive line patterns.

3. The method of claim 2, wherein the RMS surface roughness of the smoothing layer is no greater than half the thickness of the thinnest layer.

4. The method of claim 2, wherein providing a sidewall smoothing layer comprises depositing a conformal layer of a reflowable material and heat treating the reflowable material to reduce surface roughness.

5. The method of claim 2, wherein providing a sidewall smoothing layer comprises depositing a layer of a smoothing material having a thickness that is greater than the peak to peak surface roughness of the sidewall of the hole before smoothing, and heat treating or chemically treating the smoothing layer, to reduce surface roughness.

6. The method of claim 1, wherein the step of depositing of at least thinner layers of the sequence of layers comprises Atomic Layer Deposition (ALD).

7. The method of claim 6, wherein the step of depositing further comprises Chemical Vapor Deposition (CVD) for deposition of at least some of thicker layers of the sequence of layers.

8. The method of claim 1, wherein for two dimensional diffractive optics, the mesas comprise cylindrical columns having substantially vertical sidewalls.

9. The method of claim 8, wherein each column is formed within a surrounding hole or recess, the sidewall of the surrounding hole or recess being spaced from sidewalls of the column and wherein adjacent surrounding holes or recesses are spaced from each other by intervening reinforcing regions of the first substrate.

10. The method of claim 9, wherein a group of a plurality of columns is formed within each hole or recess.

11. The method of claim 1, wherein for two dimensional diffractive optics, the mesas comprise columns having a predetermined sidewall angle.

12. The method of claim 1, wherein for one dimensional diffractive optics, the mesas comprise linear forms formed within trenches, said linear forms comprising one or more of linear ridges, rectangular mesas, and square mesas, having substantially vertical sidewalls.

13. The method of claim 1, wherein for one dimensional diffractive optics, the mesas comprise linear forms formed within trenches, said linear forms comprising one or more of linear ridges, rectangular mesas, and square mesas, having a predetermined sidewall angle a relative to surfaces of the substrate.

14. The method of claim 1, wherein performing the first planarization comprises any one of: mechanical polishing, chemical polishing, chemical-mechanical polishing, ion beam polishing and a combination thereof.

15. The method of claim 1, wherein removing at least part of the carrier substrate to expose the first surface of the diffractive lines defining each of the diffractive line patterns comprises opening a plurality of windows in the carrier substrate aligned to each of the plurality of diffractive optics of the array or groups thereof.

16. The method of claim 1, wherein the carrier substrate is bonded to the planarized first surface with at least one intermediate layer, and wherein removing at least part of the carrier substrate to expose the first surface of the diffractive lines defining each of the diffractive line patterns comprises opening windows in the carrier substrate aligned to each diffractive optic to expose said intermediate layer, the at least one intermediate layer acting as a membrane support for each diffractive optic.

17. The method of claim 1, wherein performing the second planarization comprises any one of: grinding, mechanical polishing, chemical polishing, chemical-mechanical polishing, ion beam polishing and a combination thereof.

18. The method of claim 1, further comprising providing one or a plurality of additional layers on one or both of the first and second surfaces of each diffractive optic, comprising any one of:
  a) providing one or more support layers or stress reduction layers for improved mechanical properties;
  b) providing one or more thermal dissipation layers;
  c) providing one or more electrically conductive layers;
  d) providing a separation layer for constructing other planar optical devices atop of the diffractive device; and
  e) a combination thereof.

19. The method of claim 1, further comprising post-processing by any one of ion implantation, etching and heat treatment, for at least one of reshaping, trimming, stress engineering, adjusting functionality or fine tuning of optical properties of the diffractive optics.

20. The method of claim 1, wherein the first substrate comprises a crystalline silicon wafer.

21. The method of claim 1, further comprising a step of device singulation comprising substrate dicing or cleaving, to form a plurality of device structures, each comprising one or a plurality of diffractive optic elements.

22. The method of claim 1, wherein the first material M1 comprises at least one of platinum, iridium, tungsten, rhodium, osmium, zinc oxide, titanium oxide, hafnium oxide and compounds, alloys or mixtures thereof, and wherein the second material M2 comprises at least one of boron nitride, carbon, silicon dioxide, silicon nitride, aluminum oxide and compounds, or mixtures thereof.

23. The method of claim 1 wherein each layer stack comprises a sequence of N layers of materials M1, M2, ... MN, where N is $\geq 3$, the materials M1, M2, ... MN having an ordered sequence of different complex indexes of refraction at the prescribed wavelength or energy, the sequence of layers being deposited to form the sequence of m layer stacks (M1, M2, ... MN)$_1$, ... (M1, M2, ... MN)$_m$ with specified layer thicknesses to define an Nth-order diffractive optic.

24. The method of claim 1, wherein the materials and dimensions of the diffractive line pattern for each diffractive optic are selected for focusing of electromagnetic radiation having a prescribed wavelength or energy, said electromagnetic radiation comprising x rays having a prescribed energy in the range from 5 keV to hundreds of keV, and gamma rays having a prescribed energy of hundreds of keV.

25. The method of claim 1, wherein for fabricating two dimensional diffractive optics, each mesa comprises a cylindrical column, and wherein:
  each cylindrical column comprises:
    a diameter sized in a range from ~1 µm to ~2000 µm to form a core for the sequence of layers defining the diffractive line patterns;
    a side wall angle not more than 5 degrees from vertical;
    a height in a range from ~1 µm to ~200 µm, such that after planarization, the diffractive optical has a required axial height h in the direction of propagation;
    the thickness of the thinnest deposited layers of the sequence layers is between 0.2 and 100 nm; and
  wherein the aspect ratio of said axial height h to said thickness of the thinnest deposited layers is between 10:1 and 100,000:1.

26. The method of claim 1, wherein for forming one dimensional (linear) optics, each mesa comprises a linear ridge; and wherein:
  each ridge comprises:
    a width in the range from few µm to hundreds of µm and length from tens of µm to few mm, to form a core for the sequence of layers defining the diffractive line pattern;
    a height between 1 µm and 200 µm, such that after planarization, the diffractive optical has the required axial height h in the direction of propagation;
    the thickness of thinnest deposited layers of the sequence of layers is between 0.2 and 100 nm; and
  wherein the aspect ratio of said axial height h to said thickness of the thinnest deposited layers is between 10:1 and 100,000:1.

27. The method of claim 26, wherein sidewalls of the ridges are substantially vertical, and in cross-section, the ridge has a rectangular cross-section.

28. The method of claim 26, wherein each ridge has a sidewall angle a relative to planar surfaces of the substrate and wherein, in vertical cross-section, the ridge has a trapezoid cross-section.

29. The method of claim 1, wherein for a binary diffractive optic wherein in each layer stack is a pair of layers M1 and M2, and M1 has a higher absorption or refractive index than M2 at the prescribed wavelength or energy, the sequence of m layer stacks is deposited as one of:
  a) a sequence of m layer stacks (M1, M2)$_1$, (M1, M2)$_2$, ... (M1, M2)$_m$; or
  b) a sequence of m layer stacks (M2, M1)$_1$, (M2, M1)$_2$, ... (M2, M1)$_m$.

30. The method of claim 1, wherein smoothing sidewalls of the mesas to a predetermined sidewall surface roughness comprises smoothing sidewalls to an RMS surface roughness of <1 nm.

31. A method of fabrication, by batch-processing, of a plurality of device structures each comprising a high aspect-ratio diffractive optic having a specified diffractive line pattern for photons or particle beams of a prescribed wavelength or energy, comprising:
  providing a first substrate having a planar front surface and back surface;
  performing an anisotropic etch process comprising patterning of the front surface of the substrate and removal of material of the substrate to define a precursor structure comprising an array of a plurality of precursor forms comprising one of:
    a) mesas having sidewalls of predetermined vertical and lateral dimensions and sidewall angle;

b) mesas within holes or trenches, the mesas having sidewalls of predetermined vertical and lateral dimensions and sidewall angle; and c) a combination thereof;

smoothing sidewalls of the mesas to a predetermined sidewall surface roughness;

depositing thereon a sequence of layers defining the specified diffractive line pattern comprising a plurality of m layer stacks, each layer stack comprising at least a pair of layers comprising a layer of a first material (M1) and a layer of a second material (M2), said layer stacks being deposited by an isotropic deposition process providing conformal layers of controlled layer thicknesses on sidewalls of each mesa in sequence $(M1, M2)_1, (M1, M2)_2 \ldots (M1, M2)_m$, each of said first and second materials having a different selected complex refractive index at the prescribed wavelength or energy, wherein each mesa forms a core of one of the diffractive optics and said step of depositing comprises controlling the layer thickness of each pair of layers (M1, M2) of the sequence $(M1, M2)_1, (M1, M2)_2 \ldots (M1, M2)_m$ to define diffractive lines of the specified diffractive line pattern around each mesa;

after forming the sequence of layers, providing a planarization layer thereon filling remaining surface voids;

performing a first planarization to remove parts of the planarization layer and the sequence of layers and exposing a planarized front-side surface comprising a first surface of each mesa, of the diffractive lines around each mesa and surrounding parts of the planarization layer and the first substrate;

performing a second planarization to thin the backside of first substrate and remove part of the first substrate and the sequence of layers to provide a planarized back-side surface exposing a second surface each mesa, of the diffractive lines around each mesa and first substrate;

wherein, for photons or particles of the prescribed wavelength or energy, an axial height h between the first surface and second surface of each of the diffractive lines of each diffractive optic, in a propagation direction, provides at least one of:

a required absorption difference between adjacent diffractive lines, a phase shift difference of $\pi$ between adjacent diffractive lines, and a phase shift difference of a designed fraction of $\pi$ between adjacent diffractive lines;

and wherein the aspect ratio of the axial height h and the layer thickness of a thinnest layer of the sequence of layers of the diffractive line pattern is greater than 10:1; and performing device singulation comprising at least one of substrate dicing and cleaving, to form a plurality of individual device structures, each comprising one or a plurality of said diffractive optics.

32. A method of fabrication, by batch-processing, of a plurality of device structures each comprising a high aspect-ratio Fresnel zone plate having a specified Fresnel zone pattern for photons or particle beams of a prescribed wavelength or energy, comprising:

providing a first substrate having a planar front surface and back surface;

performing an anisotropic etch process comprising patterning of the front surface of the substrate and removal of material of the substrate to define a precursor structure comprising an array of a plurality of mesas comprising cylindrical columns, each formed within a surrounding hole or recess, said mesas having sidewalls of predetermined vertical and lateral dimensions and sidewall angle;

smoothing sidewalls of the mesas to a predetermined sidewall surface roughness;

depositing thereon a sequence of layers comprising a plurality of m layer stacks, each layer stack comprising at least a pair of layers comprising a layer of a first material (M1) and a layer of a second material (M2), each of said first and second materials having a different selected complex refractive index at the prescribed wavelength or energy, said layer stacks being deposited by an isotropic deposition process providing conformal layers of controlled layer thicknesses on sidewalls of each mesa in sequence $(M1, M2)_1, (M1, M2)_2 \ldots (M1, M2)_m$ wherein each mesa forms a central non-diffractive area of one of the Fresnel zone plates and said step of depositing comprising controlling the layer thickness of each pair of layers (M1, M2) of the sequence $(M1, M2)_1, (M1, M2)_2 \ldots (M1, M2)_m$ to define diffractive zones of said specified Fresnel zone pattern around each mesa;

after forming the sequence of layers, providing a planarization layer thereon filling remaining surface voids;

performing a first planarization to remove parts of the planarization layer and the sequence of layers and exposing a planarized front-side surface comprising a first surface of each mesa, of the diffractive zones around each mesa and surrounding parts of the planarization layer and the first substrate;

attaching a carrier substrate to the planarized front-side surface;

performing a second planarization to thin the backside of first substrate and remove part of the first substrate and the sequence of layers to provide a planarized back-side surface exposing a second surface each mesa, of the diffractive zones around each mesa and first substrate; and removing part of the carrier substrate to expose the first surface the Fresnel zones around each mesa, thereby producing an array of a plurality of Fresnel zone plates supported by remaining parts of the first substrate and the carrier substrate;

wherein, for photons or particles of the prescribed wavelength or energy, an axial height h between the first surface and second surface of each of the diffractive lines of each diffractive optic, in a propagation direction, provides at least one of:

a required absorption difference between adjacent diffractive lines, a phase shift difference of $\pi$ between adjacent diffractive lines, and a phase shift difference of a designed fraction of $\pi$ between adjacent diffractive lines;

and wherein the aspect ratio of the axial height h and the layer thickness of a thinnest layer of the sequence of layers of the diffractive line pattern is greater than 10:1.

\* \* \* \* \*